(12) United States Patent
Lee et al.

(10) Patent No.: US 10,461,153 B2
(45) Date of Patent: Oct. 29, 2019

(54) SEMICONDUCTOR MEMORY DEVICE AND METHOD OF MANUFACTURING THE SAME

(71) Applicant: Samsung Electronics Co., Ltd., Suwon-si (KR)

(72) Inventors: Kiseok Lee, Hwaseong-si (KR); Myeong-Dong Lee, Seoul (KR); Hui-Jung Kim, Seongnam-si (KR); Dongoh Kim, Daegu (KR); Bong-Soo Kim, Yongin-si (KR); Seokhan Park, Hwaseong-si (KR); Woosong Ahn, Hwaseong-si (KR); Sunghee Han, Hwaseong-si (KR); Yoosang Hwang, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 15/890,707

(22) Filed: Feb. 7, 2018

(65) Prior Publication Data
US 2019/0088739 A1    Mar. 21, 2019

(30) Foreign Application Priority Data

Sep. 19, 2017   (KR) .................. 10-2017-0120601

(51) Int. Cl.
*H01L 29/06* (2006.01)
*H01L 27/108* (2006.01)
(Continued)

(52) U.S. Cl.
CPC ........ *H01L 29/0649* (2013.01); *H01L 23/528* (2013.01); *H01L 23/535* (2013.01);
(Continued)

(58) Field of Classification Search
CPC ......... H01L 27/10814; H01L 27/10823; H01L 27/10855; H01L 27/10885;
(Continued)

(56) References Cited

U.S. PATENT DOCUMENTS 9,337,202 B2   5/2016   Lim et al.
9,425,280 B2   8/2016   Cai et al.
(Continued)

FOREIGN PATENT DOCUMENTS

KR   10-2015-0005817 A    1/2015

*Primary Examiner* — Ermias T Woldegeorgis
(74) *Attorney, Agent, or Firm* — Harness, Dickey & Pierce, P.L.C.

(57) ABSTRACT

A semiconductor memory device includes a substrate including active regions, word lines in the substrate and each extending in a first direction parallel to an upper surface of the substrate, bit line structures connected to the active regions, respectively, and each extending in a second direction crossing the first direction, and spacer structures on sidewalls of respective ones of the bit line structures. Each of the spacer structures includes a first spacer, a second spacer, and a third spacer. The second spacer is disposed between the first spacer and the third spacer and includes a void defined by an inner surface of the second spacer. A height of the second spacer is greater than a height of the void.

16 Claims, 35 Drawing Sheets

(51) Int. Cl.
*H01L 23/535* (2006.01)
*H01L 23/528* (2006.01)

(52) U.S. Cl.
CPC .. *H01L 27/10814* (2013.01); *H01L 27/10885* (2013.01); *H01L 27/10888* (2013.01); *H01L 27/10891* (2013.01); *H01L 27/10894* (2013.01); *H01L 27/10897* (2013.01)

(58) Field of Classification Search
CPC ......... H01L 27/10888; H01L 27/10891; H01L 27/10894; H01L 27/10897
See application file for complete search history.

(56) References Cited

U.S. PATENT DOCUMENTS

| | | |
|---|---|---|
| 9,514,980 B2 | 12/2016 | Lee et al. |
| 9,620,451 B2 | 4/2017 | Hwang et al. |
| 9,660,188 B2 | 5/2017 | Lin et al. |
| 2014/0054659 A1* | 2/2014 | Seo .................. H01L 29/41775 257/288 |
| 2014/0061736 A1* | 3/2014 | Hwang ............. H01L 21/76229 257/288 |
| 2014/0231892 A1* | 8/2014 | Song ................ H01L 21/76897 257/296 |
| 2014/0264953 A1 | 9/2014 | Lim et al. |
| 2015/0061134 A1* | 3/2015 | Lee ...................... H01L 21/764 257/751 |
| 2015/0179651 A1 | 6/2015 | Park et al. |
| 2015/0340281 A1 | 11/2015 | Lee et al. |
| 2016/0181143 A1 | 6/2016 | Kwon et al. |
| 2017/0005166 A1 | 1/2017 | Park et al. |
| 2017/0062347 A1 | 3/2017 | Kim et al. |
| 2017/0125283 A1 | 5/2017 | Lee et al. |

\* cited by examiner

SEMICONDUCTOR MEMORY DEVICE AND
METHOD OF MANUFACTURING THE SAME

CROSS-REFERENCE TO RELATED APPLICATION

This application claims priority under 35 U.S.C. § 119 to Korean Patent Application No. 10-2017-0120601, filed on Sep. 19, 2017, in the Korean Intellectual Property Office, the disclosure of which is hereby incorporated by reference in its entirety.

TECHNICAL FIELD

Example embodiments of the present disclosure relate to a semiconductor memory device and a method of manufacturing the same.

DISCUSSION OF RELATED ART

Small sized, multi-functional and/or low cost semiconductor devices are used in electronic devices. With development of an electronics industry, an integration density of a semiconductor device increases. To integrate the semiconductor device, a line width of patterns constituting the semiconductor device increasingly decreases. According to increasing demand of miniaturization of patterns, a new or high cost photolithography technique is required. Thus, it is difficult to highly integrate the semiconductor device.

SUMMARY

According to some example embodiments of inventive concepts, a semiconductor device may include a substrate including active regions, word lines in the substrate each of the word lines extending in a first direction parallel to an upper surface of the substrate, bit line structures connected to the active regions, respectively, each of the bit line structures extending in a second direction crossing the first direction, and spacer structures on sidewalls of respective ones of the bit line structures. Each of the spacer structures may include a first spacer, a second spacer, and a third spacer. The second spacer may be disposed between the first spacer and the third spacer and include a void. A height of the second spacer may be greater than a height of the void with respect to the upper surface of the substrate.

According to some example embodiments of inventive concepts, a semiconductor device may include a substrate including an active regions, a bit line structure on the substrate and connected to the active regions, and a spacer structure on a sidewall of the bit line structure. The spacer structure may include a first spacer, a second spacer, and a third spacer that may be sequentially disposed on the sidewall of the bit line structure. The second spacer may include a void defined by an inner surface of the second spacer. An upper surface of the third spacer may be lower than an upper surface of the first spacer with respect to an upper surface of the substrate.

According to some example embodiments of inventive concepts, a method of manufacturing a semiconductor device may include forming active regions in a substrate, forming bit line structures on the substrate, wherein the bit line structure may cross the active regions, forming spacer structures on sidewalls of the bit line structures, respectively, and forming contact plugs between each of the bit line structures to be connected to the active regions, respectively. The forming the spacer structures may include sequentially forming a first spacer, a sacrificial spacer, and a third spacer on each of the sidewalls of the bit line structures; removing the sacrificial spacer to form a gap region; and forming a second spacer in the gap region.

DETAILED DESCRIPTION

Figure 1:
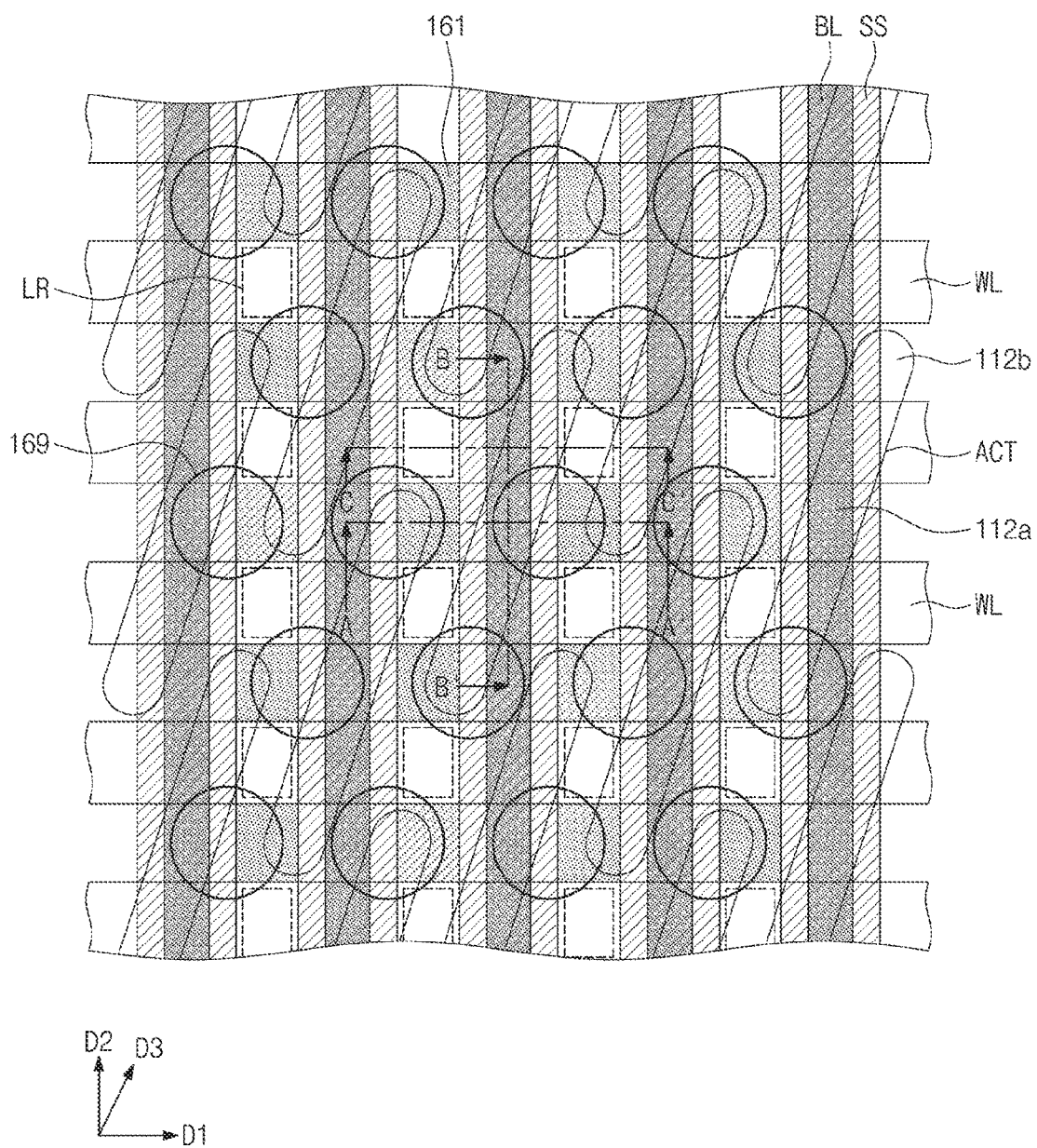
FIG. 1 is a plan view illustrating a semiconductor memory device according to some example embodiments.

Various example embodiments will now be described more fully hereinafter with reference to the accompanying drawings. Like reference numerals may refer to like elements throughout this application.

Figure 2A:
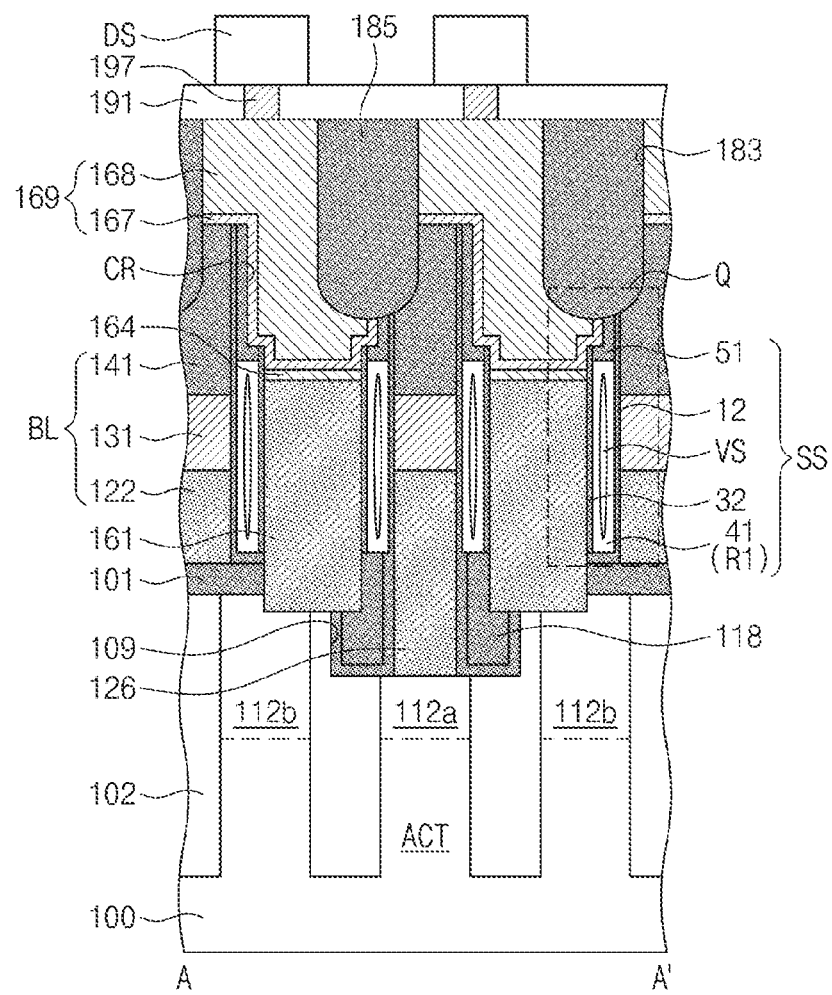
FIGS. 2A, 2B, and 2C are cross-sectional views taken along lines A-A', B-B', and C-C', respectively, illustrating a semiconductor memory device according to some example embodiments.
Figure 2B:
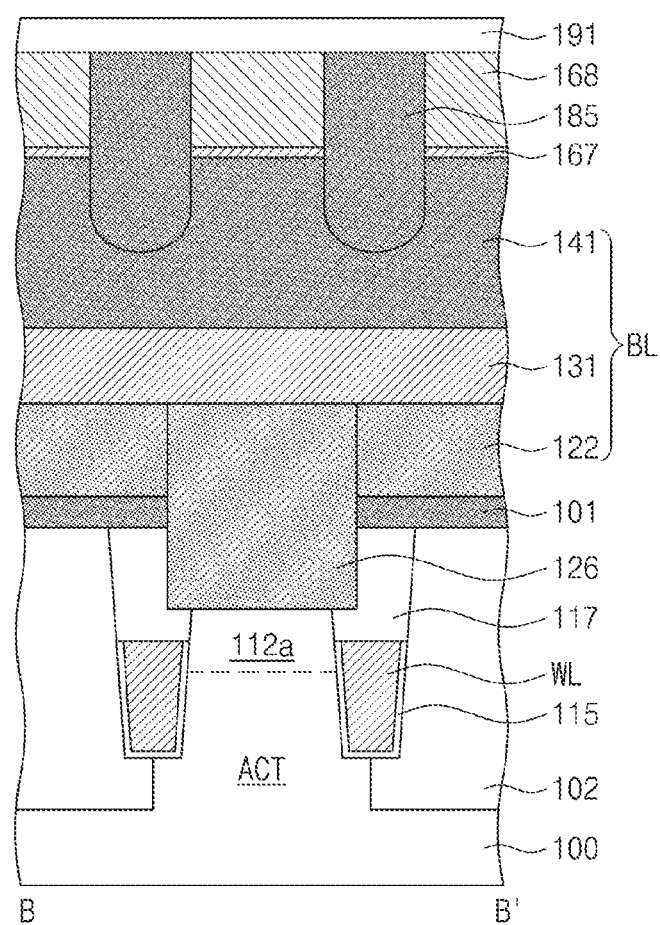
Figure 2C:
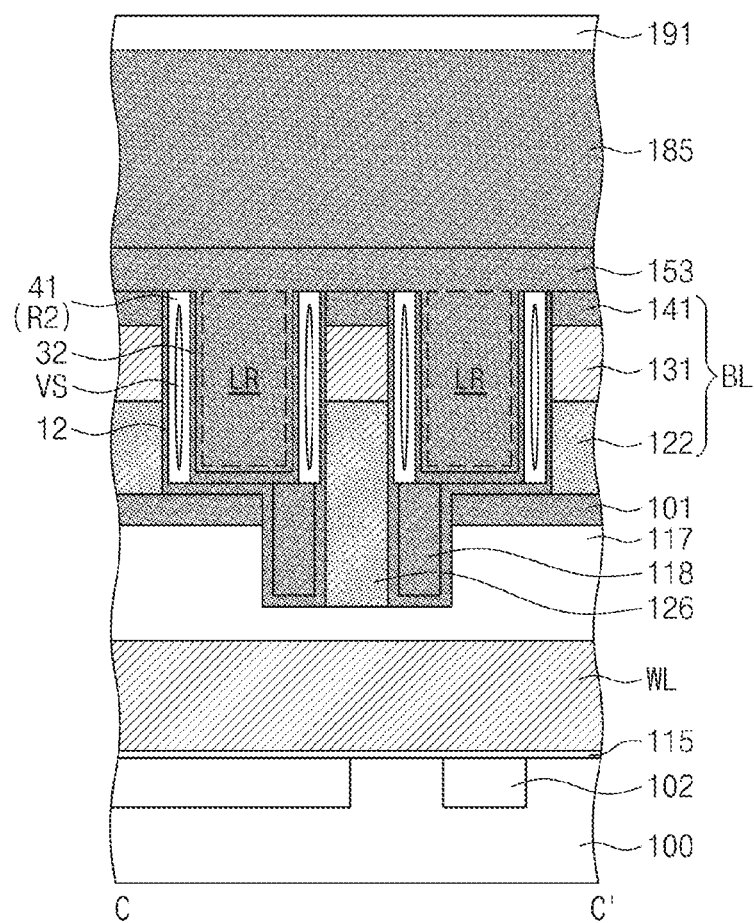
Figure 2D:
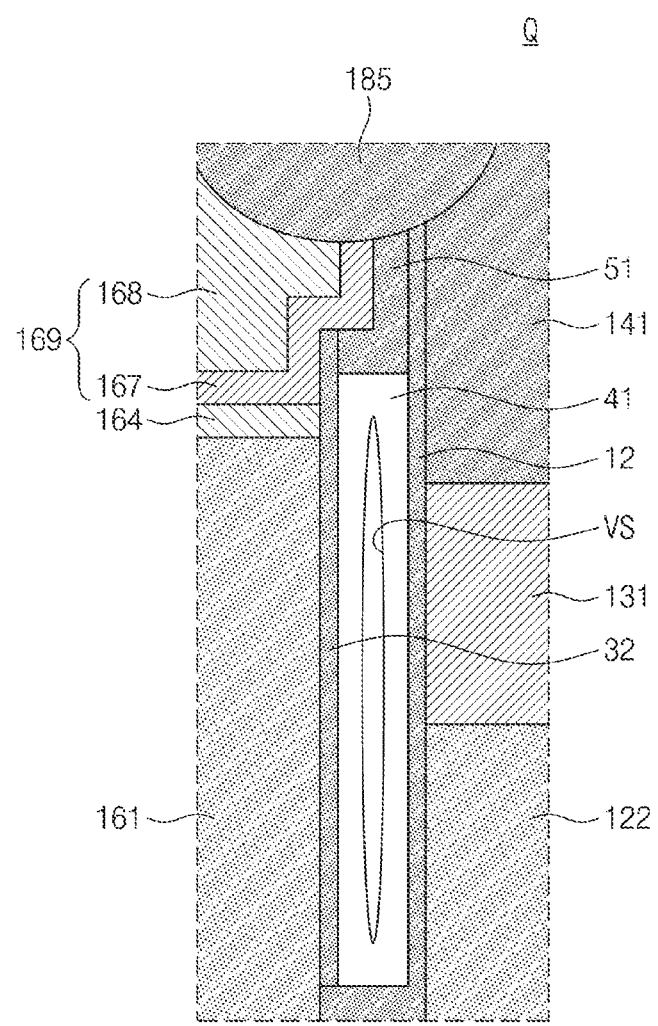
FIG. 2D is an enlarged view of portion Q of FIG. 2A.

FIG. 1 is a plan view illustrating a semiconductor memory device according to some example embodiments. FIGS. 2A, 2B, and 2C are cross-sectional views taken along lines A-A', B-B', and C-C', respectively, illustrating a semiconductor memory device according to some example embodiments. FIG. 2D is an enlarged view of portion Q of FIG. 2A.

Referring to FIGS. 1, and 2A to 2D, an isolation pattern 102 may be disposed in the substrate to define active regions ACT. The active regions ACT may each have a bar shape extending in a third direction D3 parallel to an upper surface of the substrate 100, in plan view. In plan view, the active regions ACT may correspond to portions of the substrate 100, surrounded by the isolation pattern 102. The substrate 100 may include a semiconductor material. For example, the substrate may be a silicon substrate, a germanium substrate, or a silicon-germanium substrate. The isolation pattern 102 may include oxide (e.g., silicon oxide), nitride (e.g., silicon nitride), and/or oxynitride (e.g., silicon oxynitride). The active regions ACT may be arranged parallel to each other. An end portion of one of the active regions ACT may be arranged adjacent to the center of another of the active regions ACT.

Word lines WL may traverse the active regions ACT. The word lines WL may be buried in an upper portion of the substrate 100 and each extend in a first direction D1 parallel to the upper surface of the substrate 100. The first direction D1 may cross the third direction D3. The word lines WL may include a conductive material, for example, tungsten, titanium, tantalum, and/or nitride thereof. A gate insulating layer 115 may be disposed between the substrate 100 and each of the word lines WL. The gate insulating layer 115 may include, for example, silicon oxide, silicon oxynitride, and/or a high-k dielectric material.

A pair of the active word lines WL may cross each active region ACT. Each active region ACT may include a first impurity region 112a disposed between the pair of active word lines WL. Each active region ACT may include second impurity regions 112b spaced apart from the first impurity region 112a with the pair of active word lines WL therebetween. For example, a pair of the second impurity regions 112b may be disposed in opposite edge regions, respectively, of each active region ACT. The first and second impurity regions 112a and 112b may have a different conductivity from the substrate 100. For example, the first and second impurity regions 112a and 112b may be n-type regions doped with an n-type impurity. Each of the word lines WL and the first and second impurity regions 112a and 112b adjacent thereto may constitute a transistor.

Upper surfaces of the word lines WL may be lower than upper surfaces of the active regions ACT with respect to the upper surface of the substrate 100. Word line capping patterns 117 may be disposed on the word lines WL, respectively. The word line capping patterns 117 may each have a linear shape extending in the first direction D1 along each word line WL. The word line capping patterns 117 may include, for example, silicon oxide, silicon nitride, and/or silicon oxynitride.

Bit line structures BL may be disposed on the substrate 100. The bit line structures BL may each extend in a second direction D2 parallel to the upper surface of the substrate 100 and crossing both the first and third directions D1 and D3. For example, the second direction D2 may be perpendicular to the first direction D1. Each bit line structure BL may include a first conductive pattern 122, a second conductive pattern 131, and a mask pattern 141. The first conductive pattern 122, the second conductive pattern 131, and the mask pattern 141 may respectively extend in the second direction D2.

The first conductive pattern 122 may include a semiconductor material, for example, polysilicon. The second conductive pattern 131 may include, for example, metal (e.g., tungsten, titanium, or tantalum), and/or conductive metal nitride (e.g., titanium nitride, tantalum nitride, or tungsten nitride). A barrier pattern may further be disposed between the first conductive pattern 122 and the second conductive pattern 131. The barrier pattern may include metal-silicon compound and/or conductive metal nitride. For example, the barrier pattern may include tungsten nitride and/or tungsten silicide. The mask pattern 141 may include, for example, nitride (e.g., silicon nitride) and/or oxynitride (e.g., silicon oxynitride).

Figure 3:
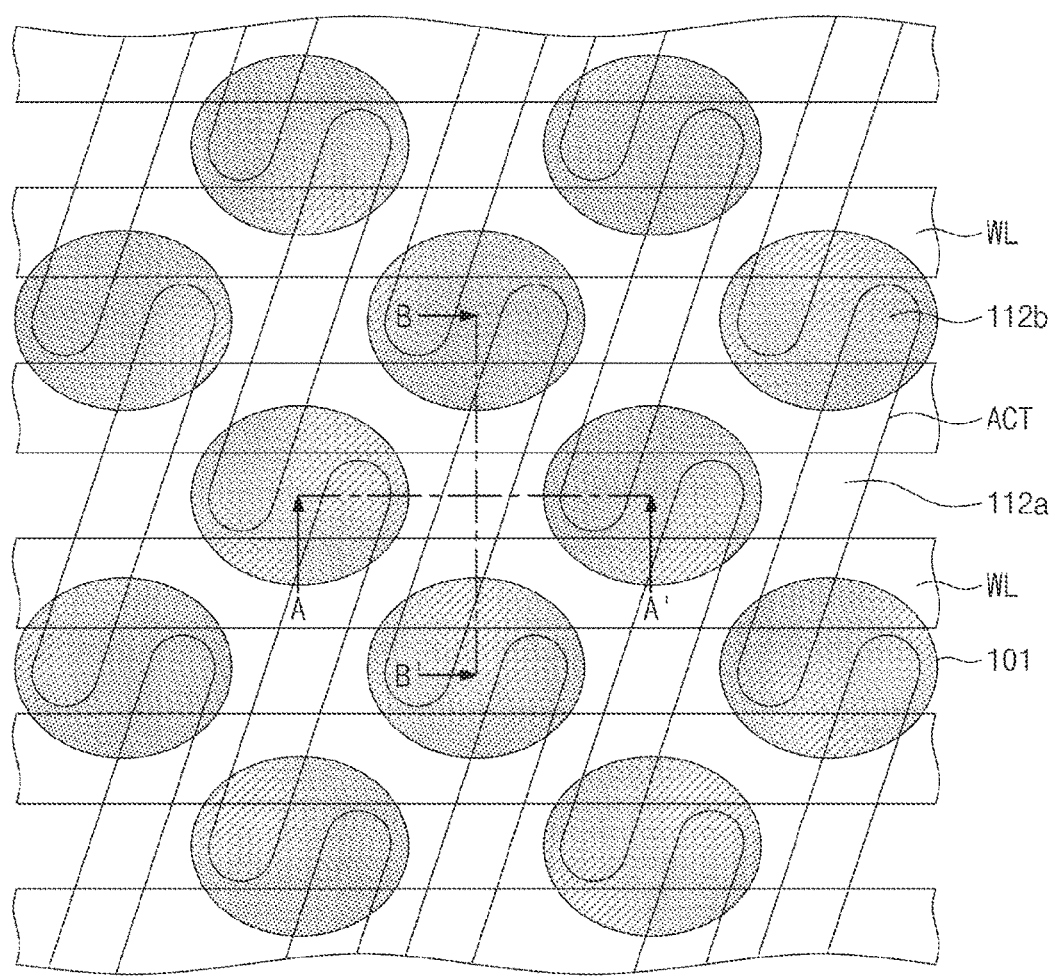
FIGS. 3, 5, 8, and 12 are plan views illustrating a method of manufacturing a semiconductor memory device according to some example embodiments.

Lower insulating patterns 101 may be disposed between each of the bit line structures BL and the substrate 100. The lower insulating patterns 101 may include, for example, silicon oxide, silicon nitride, and/or silicon oxynitride. The lower insulating patterns 101 may be arranged spaced from one another in plan view. As an example, as shown in FIG. 3, each of the lower insulating patterns 101 may cover adjacent end portions of two adjacent active patterns ACT.

First contact plugs 126 may connect the respective bit line structures BL and the respective first impurity regions 112a. In plan view, the first contact plugs 126 may be disposed at intersections of the bit line structures BL and the first impurity regions 112a. Referring to FIG. 2B, each of first contact plugs 126 may penetrate the first conductive pattern 122 and be connected to the second conductive pattern 131, bit is not limited thereto. Each of first contact plugs 126 may penetrate the lower insulating patterns 101. The first contact plugs 126 may include a semiconductor material, for example, polysilicon.

Fence insulating patterns 153 may each be disposed on the substrate 100 to extend in the first direction D1 and cross the bit line structures BL, while filling spaces between the bit line structures BL The fence insulating patterns 153 may include, for example, silicon nitride and/or silicon oxynitride. Facing sidewalls of adjacent fence insulating patterns 153 and facing sidewalls of adjacent bit line structures BL may define each of contact regions CR. The fence insulating patterns 153 may include lower portions LR, respectively, between each of the bit line structures BL. An upper surface of a portion of the mask pattern 141 adjacent to each of the lower portions LR may be lower than an upper surface of another portion of the mask pattern 141 adjacent to each of second contact plugs 161 with respect to the upper surface of the substrate 100, but is not limited thereto.

The second contact plugs 161 may be disposed in the contact regions CR, respectively. The second contact plugs 161 may be connected to the second impurity regions 112b, respectively. Upper surfaces of the second contact plugs 161 may be higher than an upper surface of the second conductive pattern 131 with respect to the upper surface of the substrate 100, but are not limited thereto. The second contact plugs 161 may include a semiconductor material, for example, doped polysilicon. The second contact plugs 161 and the lower portions LR of the fence insulating patterns 153 may be alternately arranged in the second direction D2.

Connection pads 169 may be disposed on the second contact plugs 161, respectively. Lower portions of the connection pads 169 may occupy or be disposed in upper portions of the contact regions CR, respectively. Upper portions of the connection pads 169 may extend onto the bit line structures BL, respectively. The connection pads 169 may each include a barrier layer 167 and a metal layer 168. The barrier layer 167 may include metal nitride, for example, titanium nitride, tantalum nitride, or tungsten nitride. The metal layer 168 may include, for example, titanium, tantalum, and/or tungsten. The connection pads 169 may be spaced apart from each other by a separation insulation layer 185 (also referred to as separation layer) in a separation region 183. The separation insulation layer 185 may include, for example, silicon oxide, silicon nitride, and/or silicon oxynitride.

The separation insulation layer 185 may be vertically spaced apart from a second spacer 41 to be described below. In some embodiments, a lowermost surface of the separation insulation layer 185 may be higher than an uppermost surface of the second spacer 41 with respect to the upper surface of the substrate 100.

An ohmic layer 164 may be disposed between each of the second contact plugs 161 and each of the connection pads 169. The ohmic layer 164 may include metal silicide, for example, tungsten silicide, titanium silicide, or tantalum silicide.

Spacer structures SS may be disposed on opposite sidewalls of the respective bit line structures BL. Each of the spacer structures SS may include a first spacer 12, the second spacer 41, and a third spacer 32 that are sequentially disposed on each of the sidewalls of the respective bit line structures BL. The first spacer 12, the second spacer 41, and the third spacer 32 may respectively extend in the second direction D2 along each bit line structure BL. The first spacer 12 may extend to below a lower surface of the second spacer 41. The first spacer 12 may have a L-shaped section, for example. The first spacer 12 may extend into the substrate 100 along sidewalls of each of first contact plugs 126. In some embodiments, the first spacer 12 may conformally extend along a sidewall and a lower surface of an opening 109 in the upper portion of the substrate 100. A gap-fill insulating layer 118 may fills the opening 109. The gap-fill insulating layer 118 may include, for example, silicon oxide, silicon nitride, and/or silicon oxynitride.

The third spacer 32 may be laterally spaced apart from the first spacer 12 with the second spacer 41 therebetween. A lower portion of the first spacer 12 may extend to below a lower surface of the third spacer 32 but is not limited thereto. The third spacer 32 may include the same material as the first spacer 12. For example, the first and third spacers 12 and 32 may include silicon nitride and/or silicon oxynitride. An upper surface of the third spacer 32 may be lower than an upper surface of the first spacer 12 with respect to the upper surface of the substrate 100. The upper surface of the third spacer 32 may be higher than the upper surfaces of the second contact plugs 161 with respect to upper surface of the substrate 100.

The second spacer 41 may be disposed between the first spacer 12 and the third spacer 32. The second spacer 41 may include a void VS therein (e.g., void VS defined by inner surface of second spacer 41). As used herein, the term void refers to include an interface in a solid material, referred to as a seam, as well as an empty space filled with gas, such as air, but not a solid phase material. In some embodiments, the second spacer 41 may be formed by filling a space between the first and third spacers 12 and 32 with an insulating material. A vertical cross-section of the void VS may have a major axis extending along a direction perpendicular to the upper surface of the substrate 100. For example, the major axis of the void VS may correspond to a height of the void VS. A height of the second spacer 41 may be greater than the height of the void VS with respect to the upper surface of the substrate 100.

The second spacer 41 may include a material having an etch selectivity with respect to the first and third spacers 12 and 32. For example, the second spacer 41 may include silicon oxide or silicon oxycarbide. A thickness of the second spacer 41 may be greater than a thickness of the first spacer 12 and a thickness of the third spacer 32 in the first direction D1, adjacent to a middle portion of each bit line structure BL. The thickness of the first spacer 12 may be substantially equal to the thickness of the third spacer 32, but is not limited thereto.

The second spacer 41 may have various heights depending on a location thereof. For example, the second spacer 41 may include first portions R1, which each are disposed between each of the second contact plugs 161 and each of the bit line structures BL, and second portions R2, which each are disposed between each of the lower portions LR of the fence insulating patterns 153 and each of the bit line structures BL. A height of upper surfaces of the second portions R2 may be lower than a height of upper surfaces of the first portions R1 with respect to the upper surface of the substrate 100. Alternatively, the height of the upper surfaces of the second portions R2 may be equal to or higher than the height of the upper surfaces of the first portions R1 with respect to the upper surface of the substrate 100.

Each of the spacer structures SS may further include a fourth spacer 51 on an upper surface of the second spacer 41. The upper surface of the second spacer 41 may be lower than the upper surface of the third spacer 32 with respect to the upper surface of the substrate 100. The fourth spacer 51 may extend along a sidewall of the first spacer 12 and along the upper surface of the second spacer 41. The fourth spacer 51 may have a L-shaped section, for example. The fourth spacer 51 may be disposed on the first portions R1 of the second spacer 41. The fourth spacer 51 may include, for example, silicon nitride and/or silicon oxynitride.

An insulating interlayer 191 may be disposed on the connection pads 169. The insulating interlayer 191 may include, for example, silicon oxide and/or silicon oxynitride. Data storage units DS may be disposed on the insulating interlayer 191. Each of the data storage units DS may be electrically connected to each of the connection pads 169 through each of via plugs 197 penetrating the insulating interlayer 191. Each of the data storage units DS may be electrically connected to each of the second impurity regions 112b via each of the connection pads 169 and each of the second contact plugs 161. Each of the data storage units DS may be a capacitor including a lower electrode, a dielectric layer, and an upper electrode. In some embodiments, each of the data storage units DS may include a magnetic tunnel junction pattern. In some embodiments, each of the data storage units DS may include a phase change material or a variable resistive material.

According to some example embodiments of inventive concepts, the second spacer 41 may have a lower dielectric constant than silicon oxide by the void VS therein, such that a parasitic capacitance between each of the second contact plugs 161 and each of the bit line structures BL may be decreased. Therefore, the semiconductor memory device may have an enhanced reliability. Additionally, as the parasitic capacitance is decreased, a distance between each of the second contact plugs 161 and each of the bit line structures BL may be reduced, thus highly integrating the semiconductor memory device.

Figure 4:
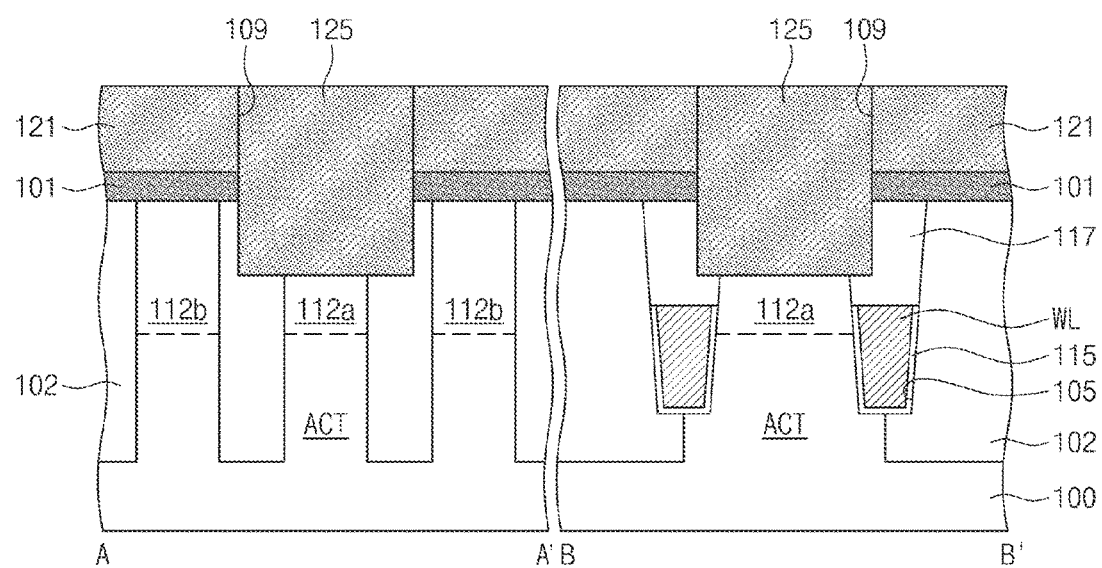
FIG. 4. is a cross-sectional view taken along lines A-A' and B-B' of FIG. 3.
Figure 10:
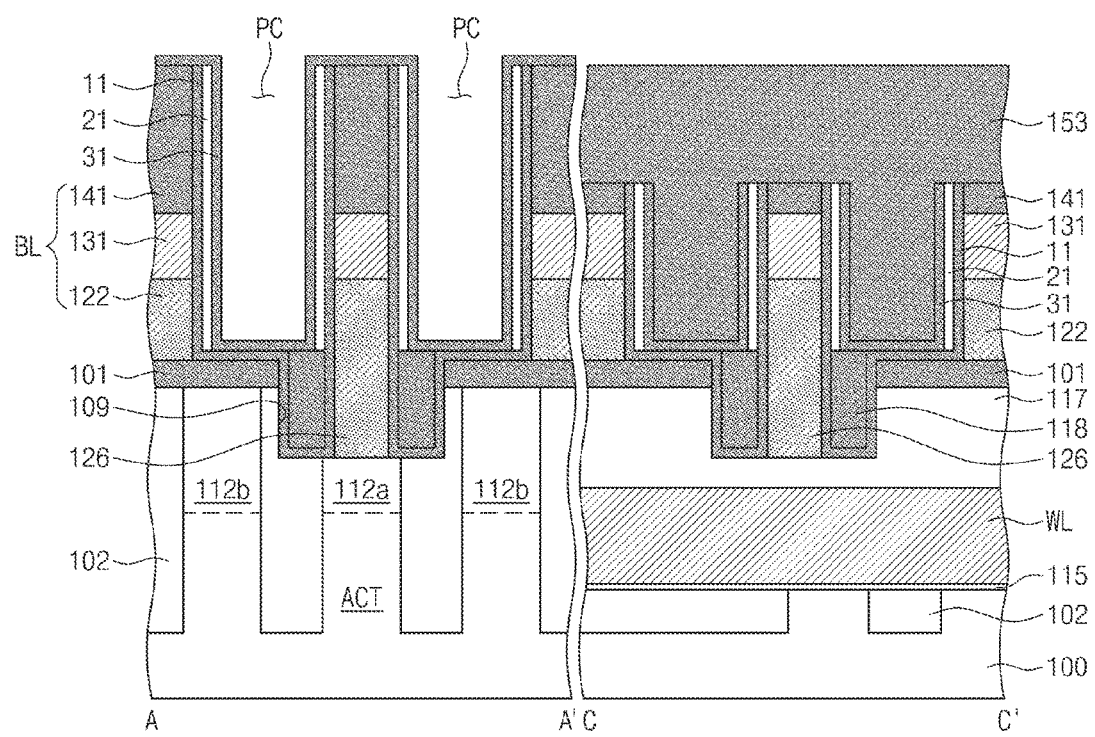
Figure 11:
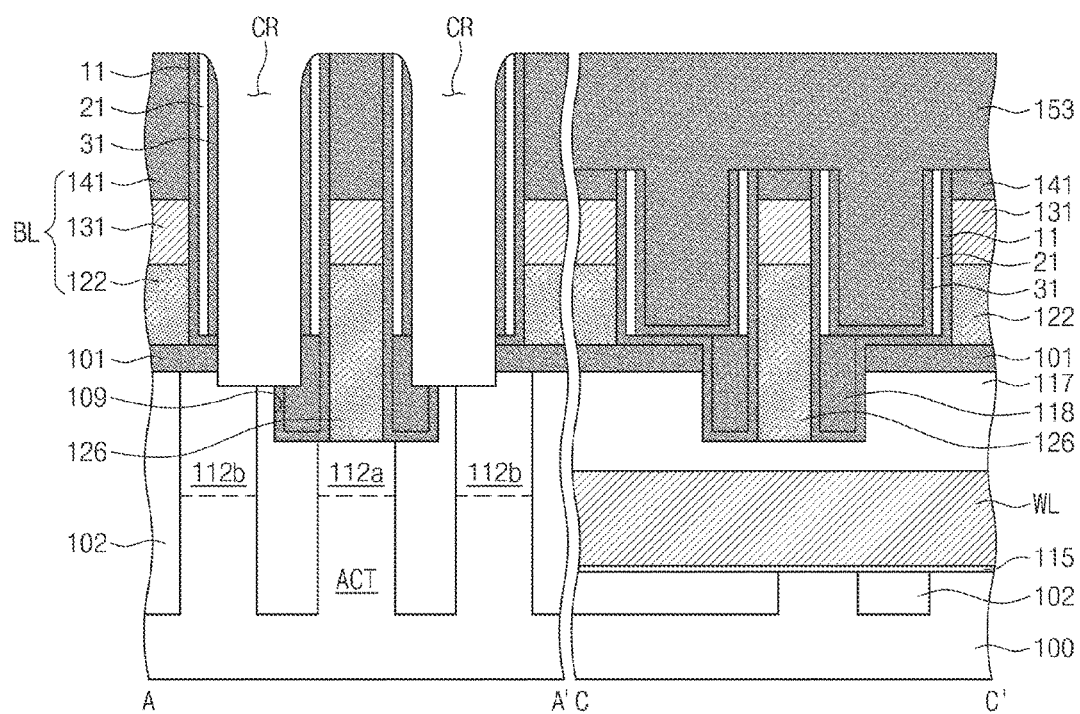

FIGS. 3, 5, 8, and 12 are plan views illustrating a method of manufacturing a semiconductor memory device according to some example embodiments. FIG. 4. is a cross-sectional view taken along lines A-A' and B-B' of FIG. 3. FIG. 6 is a cross-sectional view taken along lines A-A' and B-B' of FIG. 5. FIG. 7 is a cross-sectional view taken along lines A-A' and C-C' of FIG. 5. FIGS. 9, 10, and 11 are cross-sectional views taken along lines A-A' and C-C' of FIG. 8. FIGS. 13, 14, 15, 16, are cross-sectional view taken along lines A-A' and C-C' of FIG. 12.

Referring to FIGS. 3 and 4, the isolation pattern 102 may be formed in the substrate 100 to define the active regions ACT. The isolation pattern 102 may be formed by forming an isolation trench in the substrate 100 and filling the isolation trench with an insulating material. In plan view, each of the active regions ACT may have a bar shape extending in the third direction D3. The impurity regions may be formed in upper portions of the active regions ACT, respectively, by performing an ion-implantation process using the isolation pattern 102 as an ion-implantation mask. The active regions ACT and the isolation pattern 102 may be patterned to form recess regions 105. A pair of the recess regions 105 may traverse each of the active regions ACT. Each of the impurity regions may be separated by the pair of recess regions 105, thus forming the first impurity region 112a and the second impurity regions 112b. The gate insulating layer 115 may be formed on inner surfaces of the recess regions 105. The gate insulating layer 115 may be formed by thermal oxidation, chemical vapor deposition, and/or atomic layer deposition. A gate conductive layer may be formed in the recess regions 105. The gate conductive layer may be etched to form the word lines WL in the recess regions 105, respectively. Upper surfaces of the word lines WL may be recessed to be lower than upper surfaces of the active regions ACT. An insulating layer may be formed on the substrate 100 to fill remain portions of the recess regions 105 and be etched, such that the word line capping patterns 117 may be formed on the word lines WL, respectively.

An insulating layer and a conductive layer may be sequentially formed on the substrate 100 and be patterned to form the lower insulating pattern 101 and the first conductive layer 121 that are sequentially stacked on the substrate 100. The lower insulating pattern 101 may include silicon oxide, silicon nitride, and/or silicon oxynitride. The lower insulating pattern 101 may be formed of a plurality of spaced patterns. The first conductive layer 121 may have a shape corresponding to a plane shape of the lower insulating pattern 101. The lower insulating pattern 101 may cover adjacent edge portions (e.g., adjacent second impurity regions 112b) of two adjacent active patterns ACT.

The isolation pattern 102, an upper portion of the substrate 100, and an upper portion of the word line capping pattern 117 may be etched using the first conductive layer 121 and the lower insulating pattern 101 as an etch mask to form the opening 109. The opening 109 may expose the first impurity regions 112a.

A preliminary contact pattern 125 may be formed in the opening 109. The preliminary contact pattern 125 may be formed by forming a conductive layer and planarizing the conductive layer. The preliminary contact pattern 125 may include, for example, polysilicon.

Figure 5:
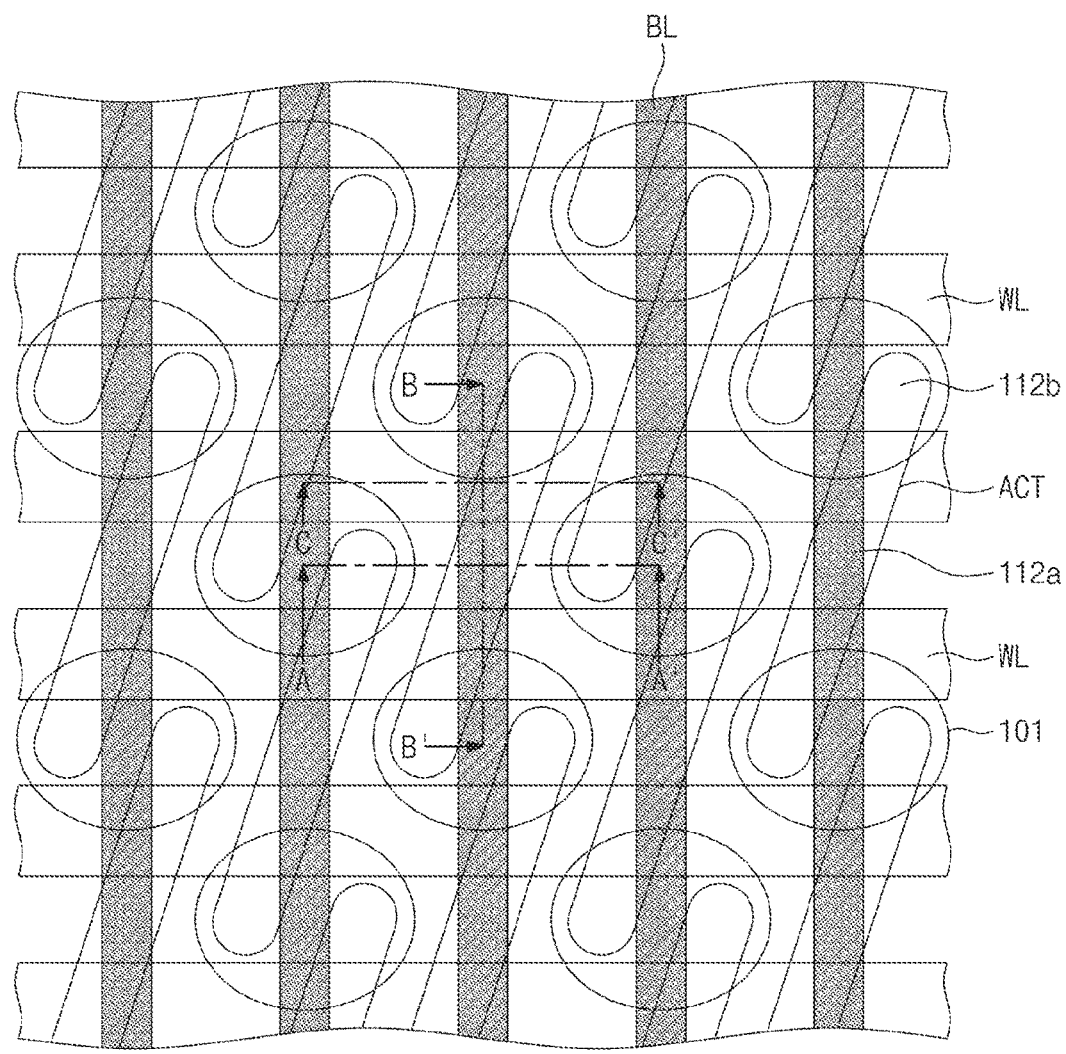
Figure 6:
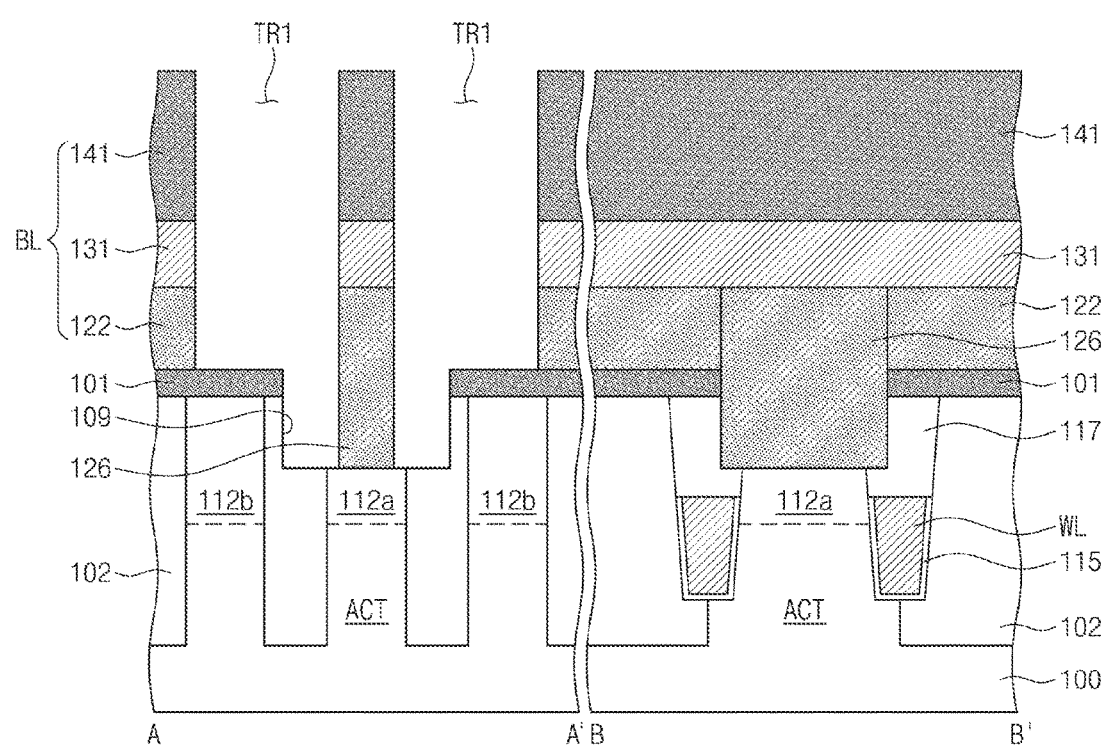
FIG. 6 is a cross-sectional view taken along lines A-A' and B-B' of FIG. 5.
Figure 7:
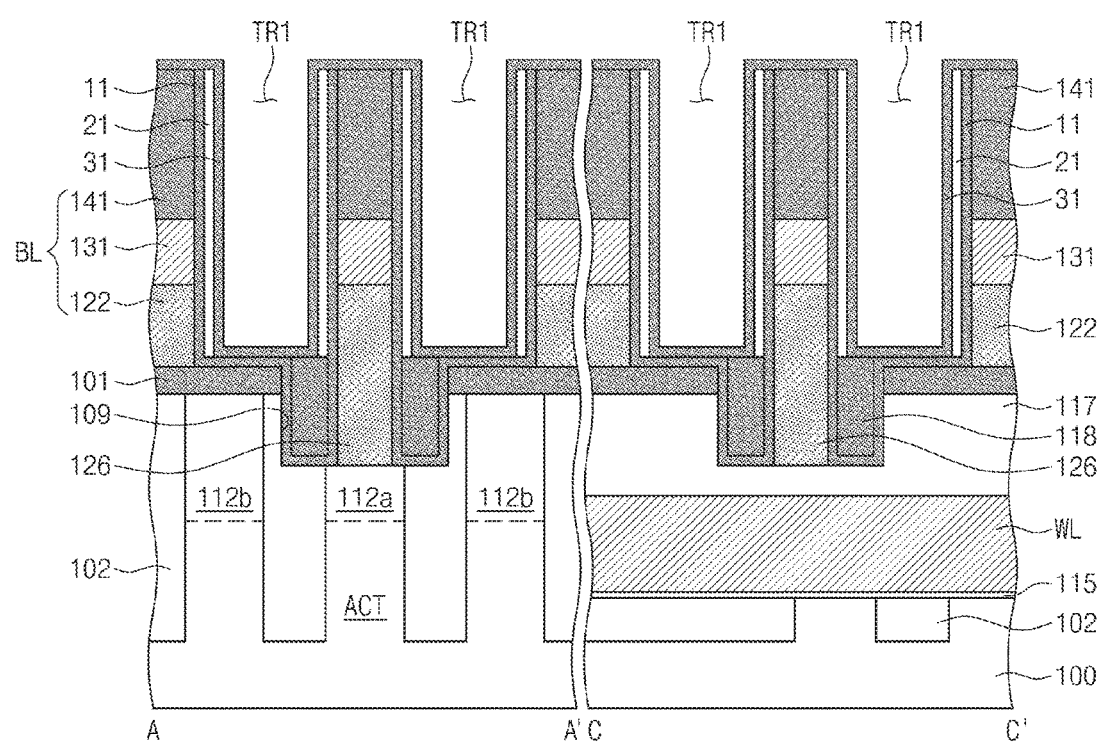
FIG. 7 is a cross-sectional view taken along lines A-A' and C-C' of FIG. 5.

Referring to FIGS. 5 and 6, after sequentially forming a second conductive layer and the mask pattern 141 on the first conductive layer 121 and on the preliminary contact pattern 125, the second conductive layer and the first conductive layer 121 may be sequentially etched using the mask pattern 141 as an etch mask, such that the bit line structures BL each including the first conductive pattern 122, the second conductive pattern 131 and the mask pattern 141 may be formed. As an example, the above etch process may include an anisotropic etch process. The preliminary contact pattern 125 may also be etched to form the first contact plugs 126. The bit line structures BL may be spaced from each other by first trenches TR1 each extending in the second direction D2. The first trenches TR1 may each expose a sidewall and a portion of a lower surface of the opening 109.

Referring to FIGS. 5 and 7, the first spacer layer 11 may be conformally formed in the first trenches TR1. The first spacer layer 11 may be formed by, for example, chemical vapor deposition or atomic layer deposition. The first spacer layer 11 may extend along the sidewall and the lower surface of the opening 109. The first spacer layer 11 may include, for example, silicon nitride or silicon oxynitride.

The gap-fill insulating layer 118 may be formed in the opening 109. The gap-fill insulating layer 118 may be formed by forming an insulating layer filling the opening 109 and performing an etch back process. Upper portion of the first spacer layer 11 may be removed during the etch back process. The gap-fill insulating layer 118 may include, for example, silicon oxide, silicon nitride, and/or silicon oxynitride.

Sacrificial spacers 21 may be formed on a sidewall of the first spacer layer 11. The sacrificial spacers 21 may be formed by, after forming an insulating layer on the resulting structure having the gap-fill insulating layer 118, performing an anisotropic etch process. The sacrificial spacers 21 may include a material having an etch selectivity with respect to the first spacer layer 11. For example, the sacrificial spacers 21 may include silicon oxide.

A third spacer layer 31 may be formed on the sacrificial spacers 21. The third spacer layer 31 may be conformally formed in the first trenches TR1. Third spacer layer 31 may include substantially the same material as the first spacer layer 11. For example, the third spacer layer 31 may include silicon nitride or silicon oxynitride.

Figure 8:
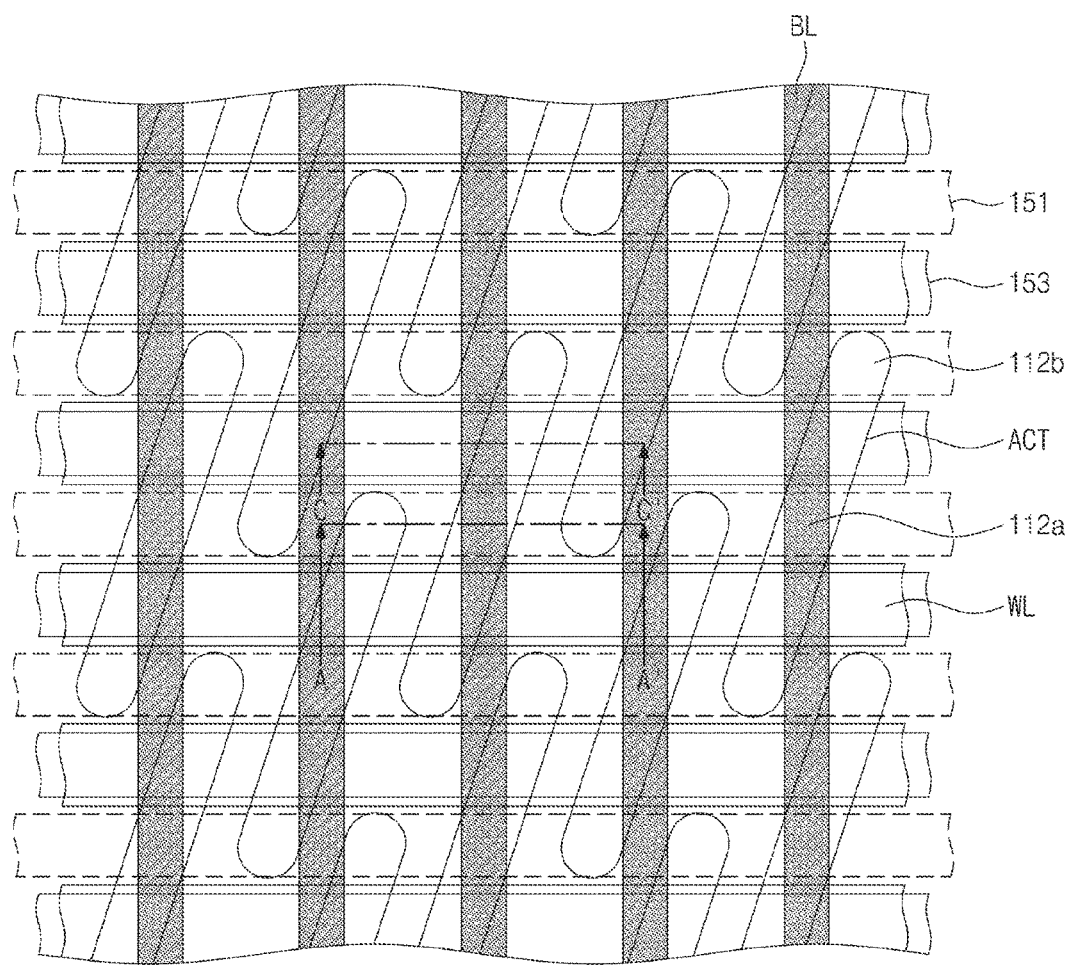
Figure 9:
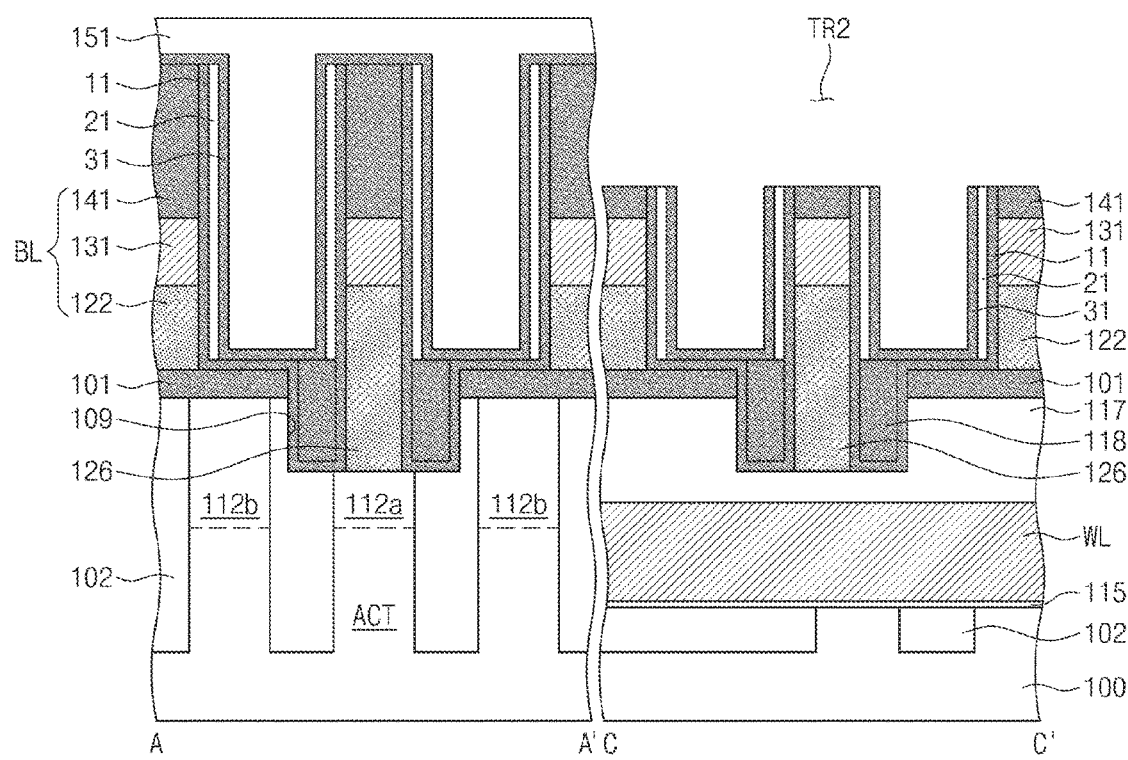
FIGS. 9, 10, and 11 are cross-sectional views taken along lines A-A' and C-C' of FIG. 8.

Referring to FIGS. 8 and 9, mold patterns 151 each extending in the first direction D1 may be formed on the substrate 100. The mold patterns 151 may include a material having an etch selectivity with respect to the mask patterns 141. For example, the mold patterns 151 may include silicon oxide. In plan view, the mold patterns 151 may be disposed between each of word lines WL. The mold patterns 151 may each fill portions of first trenches TR1 and extend on the bit line structures BL. Second trenches TR2 may be defined between each of the mold patterns 151. When the mold patterns 151 are formed, the bit line structures (e.g., upper portions of the mask patterns 141) may be etched. Portions of the first and third spacer layers 11 and 31 and portions of the sacrificial spacers 21 may also be etched. A removal amount of the mask patterns 141 and a depth of the second trenches TR2 resulting therefrom may be determined according to adjustment of an etch selectivity in the forming process of the mold patterns 151.

Referring to FIGS. 8 and 10, the fence insulating patterns 153 may be formed in the second trenches TR2. The fence insulating patterns 153 may each have a linear shape extending in the first direction D1. The fence insulating patterns 153 may overlap the word lines WL, respectively, in plan view. The fence insulating patterns 153 may include a material having an etch selectivity with respect to the mold patterns 151. The fence insulating patterns 153 may include, for example, silicon nitride or silicon oxynitride.

The mold patterns 151 may be selectively removed to form preliminary contact regions PC. Each of the preliminary contact regions PC may be defined by facing sidewalls of adjacent fence insulating patterns 153 and facing sidewalls of adjacent bit line structures BL.

Referring to FIGS. 8 and 11, an anisotropic etch process performed using the fence insulating patterns 153 and the mask patterns 141 as an etch mask to expose the second impurity regions 112b. By the above etch process, the lower insulating pattern 101 and portions of the first and third spacer layers 11 and 31 may be etched together. The preliminary contact regions PC may extend toward the substrate 100 to form the contact regions CR. The forming process of the contact regions CR may be separately performed from the removing process of the mold patterns 151. In some embodiments, the forming process of the contact regions CR may be successively performed by substantially the same etch process as the removing process of the mold patterns 151.

Figure 12:
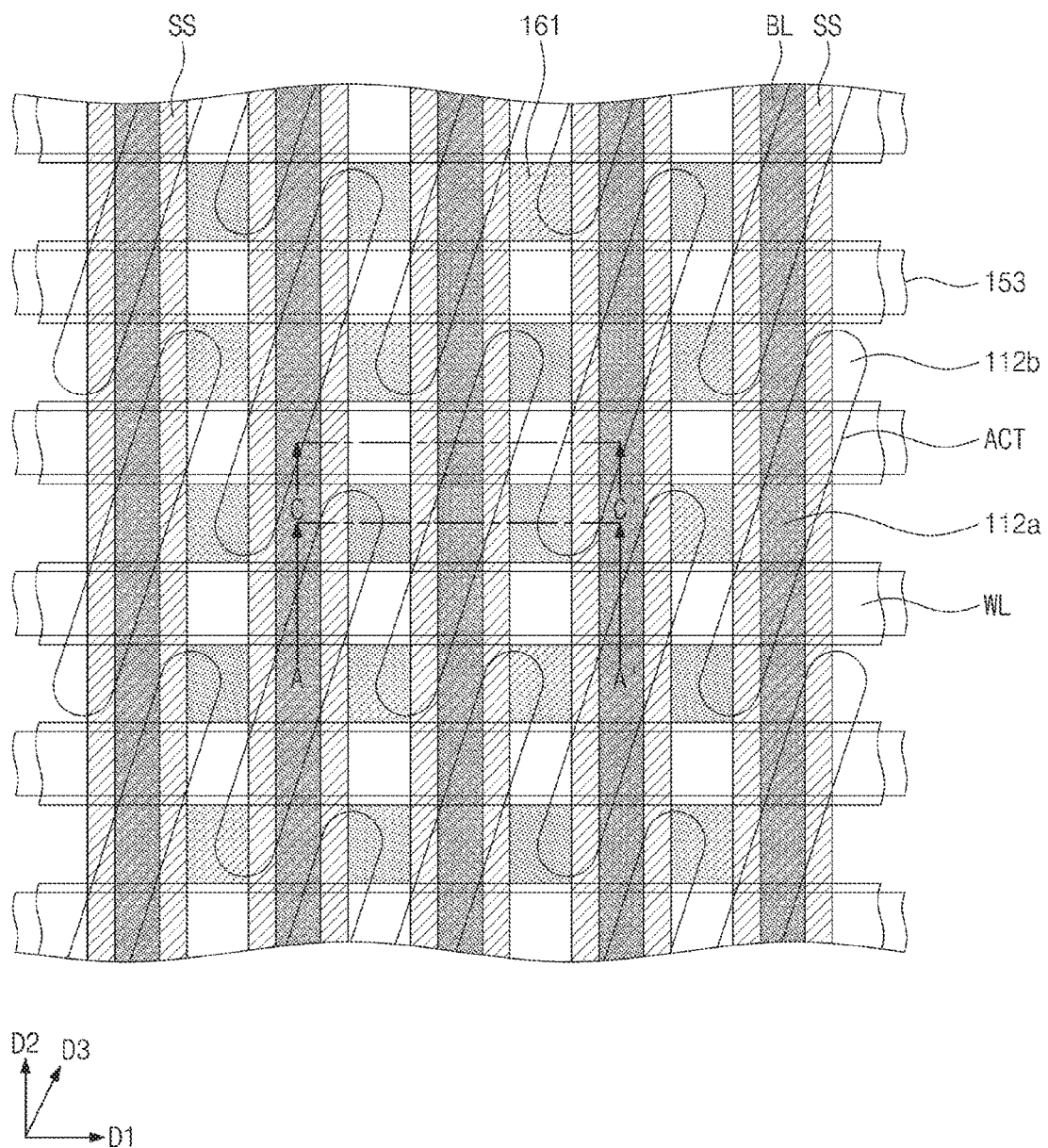
Figure 13:
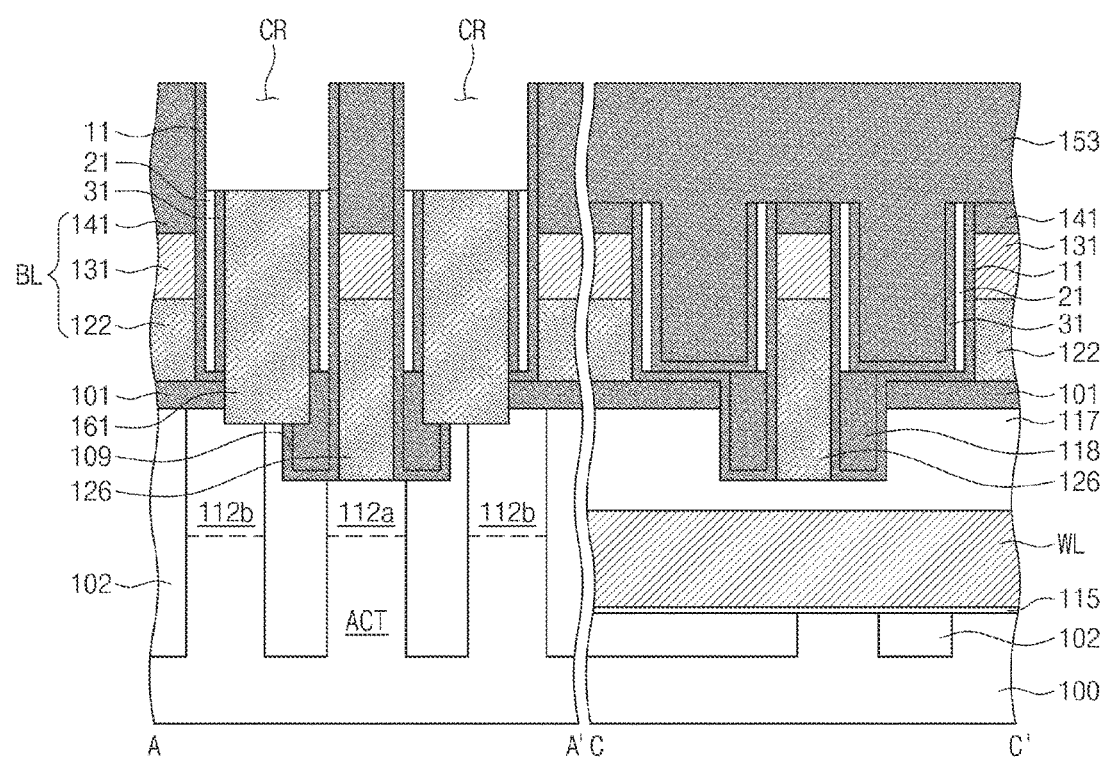
FIGS. 13, 14, 15, and 16 are cross-sectional view taken along lines A-A' and C-C' of FIG. 12.

Referring to FIGS. 12 and 13, the second contact plugs 161 may be formed in lower portions of the contact regions CR, respectively. The second contact plugs 161 may include a semiconductor material, for example, polysilicon. As an example, the second contact plugs 161 may be formed by, after forming a polysilicon layer filling the contact regions CR, performing an etch back process. The upper surfaces of the second contact plugs 161 may be higher than upper surfaces of the second conductive patterns 131 with respect to the upper surface of the substrate 100.

Upper portions of the sacrificial spacers 21 and an upper portion of the third spacer layer 31 which are exposed by the first contact plugs 126 may be etched. Thus, an upper portion of each of the contact regions CR may be defined by the sidewall of the first spacer layer 11. The upper portions of the sacrificial spacers 21 and the upper portion of the third spacer layer 31 may be removed during the etch back process of the polysilicon layer. In some embodiments, the upper portions of the sacrificial spacers 21 and the upper portion of the third spacer layer 31 may be removed by a separate etch process.

Figure 14:
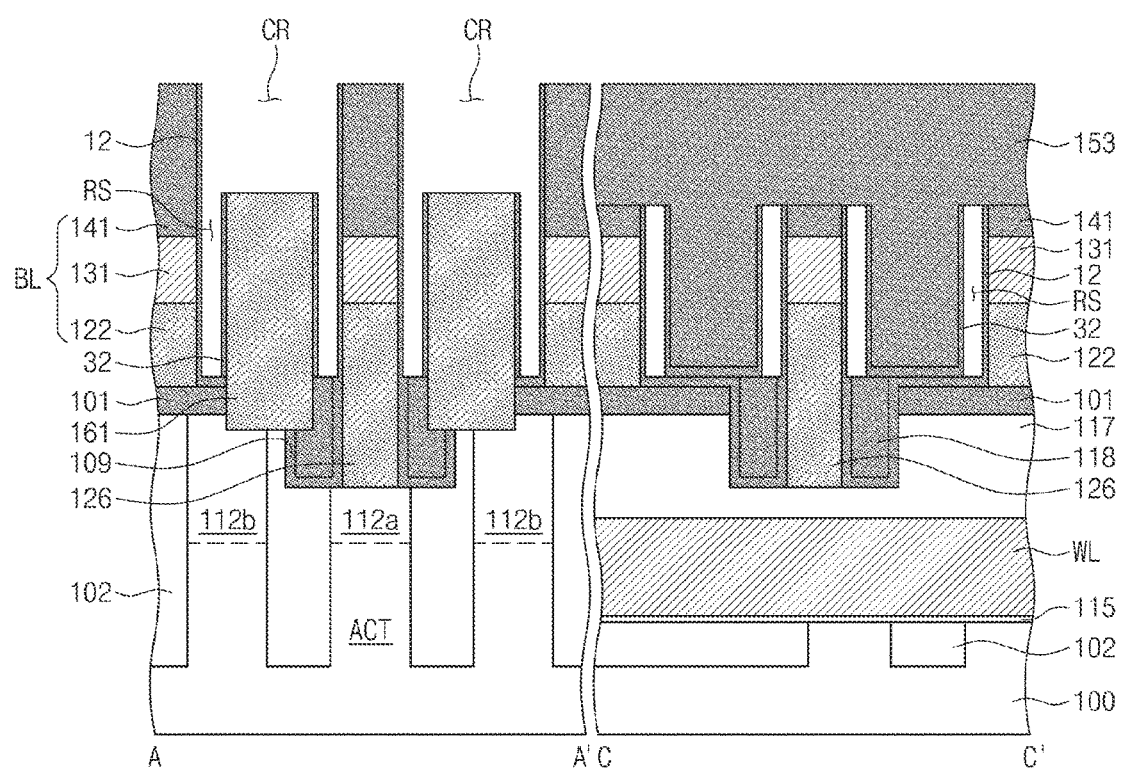

Referring to FIGS. 12 and 14, the sacrificial spacers 21 may be selectively removed to form gap regions RS. The removing of the sacrificial spacers 21 may be performed through the upper portions of the contact regions CR. Even portions of the sacrificial spacers 21 covered by the fence insulating patterns 153 may be laterally etched by an etch process through the contact regions CR.

A thickness of each of the first and third spacer layers 11 and 31 in the first direction D1 may be reduced, thus forming the first spacers 12 and the third spacers 32. The thickness of each of the first and third spacers 12 and 32 may be determined based on adjustment of an etch selectivity in the removing process of the sacrificial spacers 21. As an example, the thickness of each of the first and third spacers 12 and 32 may be about 30% to about 60% of the thickness of each of the first and third spacer layers 11 and 31. At least portions of the first and third spacer layers 11 and 31 may remain on the substrate 100. In some embodiments, the gap regions RS may expose sidewalls of the bit line structures BL and/or sidewalls of the second contact plugs 161, and the second spacers 41 (that are described below) may be formed to contact the sidewalls of the bit line structures BL and/or the sidewalls of the second contact plugs 161.

Figure 15:
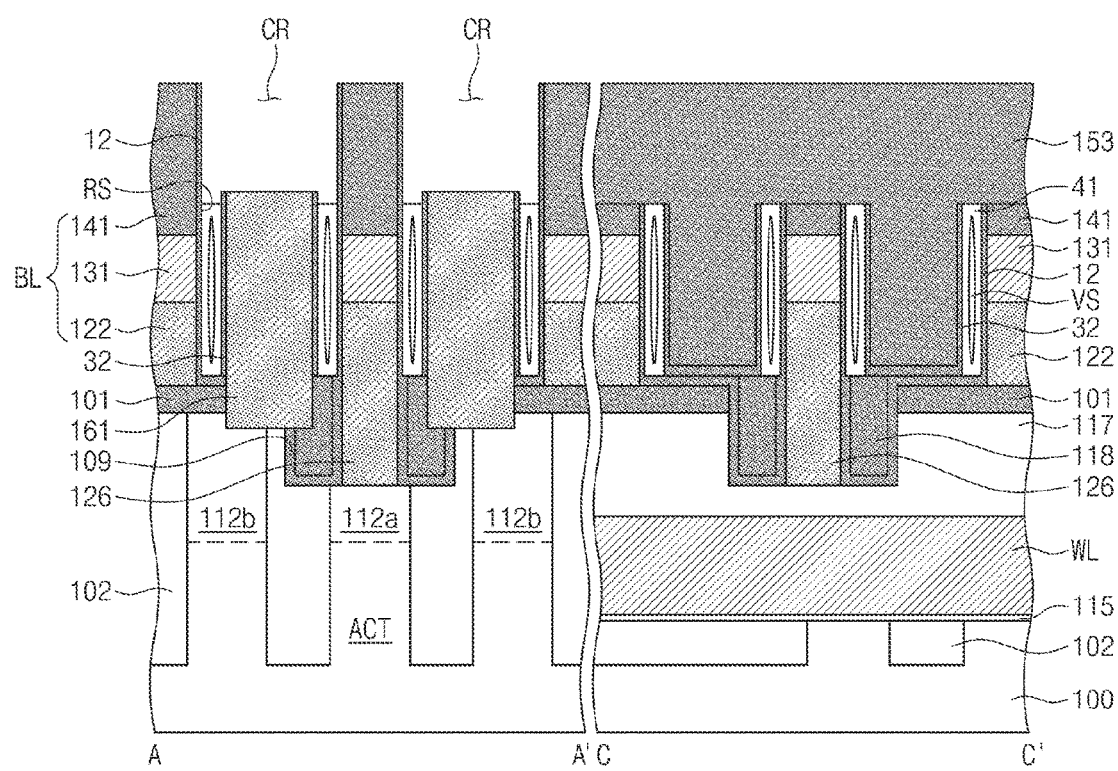

Referring to FIGS. 12 and 15, the second spacers 41 may be formed in the gap regions RS, respectively. The second spacers 41 may be formed by forming an insulating layer on the resulting structure having the gap regions RS and performing an etch process. The above etch process may be, for example, a wet etch process. The second spacers 41 may include silicon oxide or silicon oxycarbide. The second spacers 41 may each be formed to include a void VS. A shape, size, or location of the void may be determined based on a material property of the insulating layer filling the gap regions RS, or a deposition property thereof. As an example, when the gap regions RS are filled with the insulating layer having low step coverage, a relatively large void VS may be formed in each of the second spacers 41. In some embodiments, when the insulating layer is formed in the gap regions RS by a high step coverage process, such as atomic layer deposition, a relatively small void VS may be formed each of the second spacers 41, or portions of the insulating layer formed on respective sidewalls of each of the gap regions RS may meet such that an interface therebetween, such as a seam, may be formed. In the contact regions CR, upper surfaces of the second spacers 41 may be lower than upper surfaces of the third spacers 32 with respect to the upper surface of the substrate 100.

Figure 16:
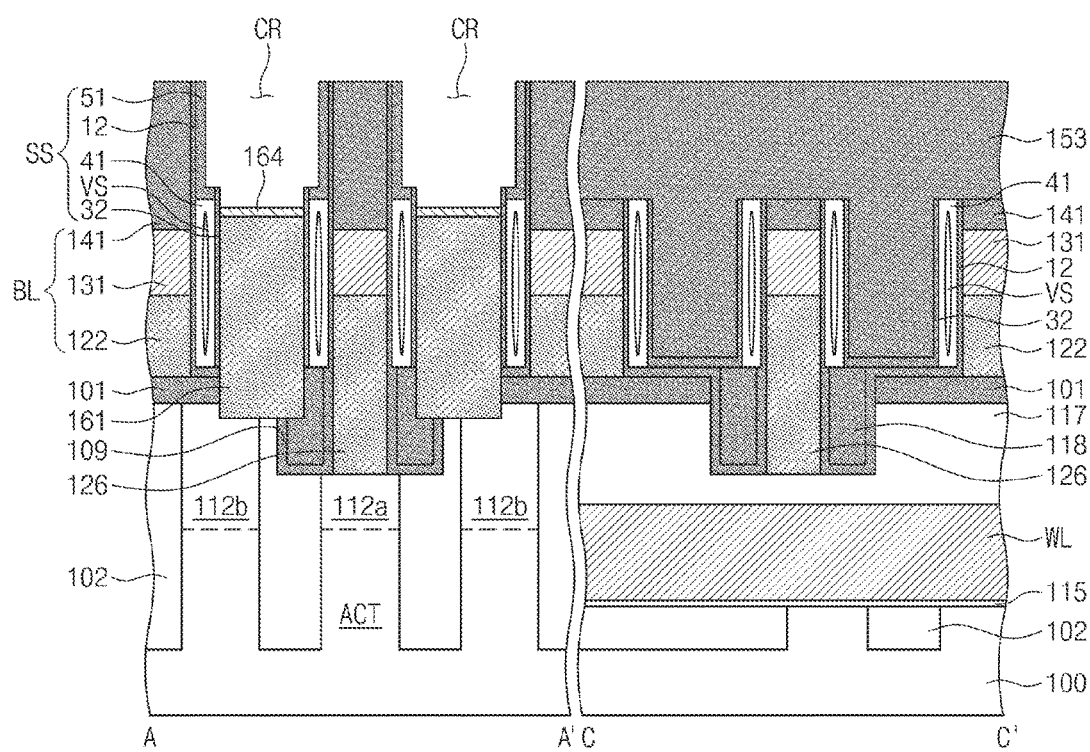

Referring to FIGS. 12 and 16, the fourth spacers 51 may be formed on the second spacers 41, respectively. The fourth spacers 51 may be formed in the contact regions CR, respectively. The fourth spacers 51 may include, for example, silicon nitride or silicon oxynitride. The fourth spacers 51 may include the same material as the first and third spacers 12 and 32, for example. A lower portion of each of the fourth spacers 51 may be disposed in a space between each of the first spacers 12 and each of the third spacers 32. An upper portion of each of the fourth spacers 51 may extend along a sidewall of each of the first spacers 12.

The forming process of the fourth spacers 51 may include an etch process, such as an etch back process. During the above etch process, upper portions of the second contact plugs 161 may also be etched. Thus, the upper surfaces of the second contact plugs 161 may be lower than the upper surfaces of the third spacers 32 with respect to the upper surface of the substrate 100. Ohmic layers 164 may be formed on the second contact plugs 161, respectively. The ohmic layers 164 may be formed by a metal deposition and annealing process. The ohmic layers 164 may include metal silicide, for example, tungsten silicide, titanium silicide, or tantalum silicide.

Referring again to FIGS. 1 and 2A to 2D, the connection pads 169 may be formed on the ohmic layers 164, respectively. The connection pads 169 may be formed after forming the second spacers 41. The connection pads 169 may be disposed on the second contact plugs 161, respectively. Each of the connection pads 169 may extend from the upper portion of each of the contact regions CR onto an upper surface of each of the bit line structures BL. Each of the connection pads 169 may include the barrier layer 167 and the metal layer 168. The barrier layer 167 may include conductive metal nitride, for example, titanium nitride, tantalum nitride, or tungsten nitride. The metal layer 168 may include, for example, titanium, tungsten, and/or tantalum.

The connection pads 169 may be formed by sequentially forming the barrier layer 167 and the metal layer 168 and performing a patterning process to form the separation region 183 passing therethrough. A lowermost surface of the separation region 183 may be higher than uppermost surfaces of the second spacers 41 with respect to the upper surface of the substrate 100. The separation region 183 may not expose the second spacers 41. The separation insulation layer 185 may be formed in the separation region 183. The connection pads 169 may be separated from each other by the separation insulation layer 185. The separation insulation layer 185 may include, for example, silicon oxide, silicon nitride, and/or silicon oxynitride.

The insulating interlayer 191 may be formed on the connection pads 169. The insulating interlayer 191 may include, for example, silicon oxide or silicon oxynitride. The via plugs 197 may be formed in the insulating interlayer 191. The data storage units DS may be formed on the via plugs 197, respectively. As an example, each of the data storage unit DS may be a capacitor including a lower electrode, a dielectric layer, and an upper electrode.

According to some example embodiments of the present inventive concepts, the second spacers 41 including the voids VS may be formed. Each of the second spacers 41 may be formed thicker than each of the first and third spacers 12 and 32. Thus, the parasitic capacitance between each of the second contact plugs 161 and each of the bit line structures BL may be reduced. Since the forming process of the second spacers 41 including the voids VS may have relatively small film deposition distribution compared to a process of blocking upper portions of the gap regions RS, the reliability of the semiconductor memory device may be enhanced.

Figure 17:
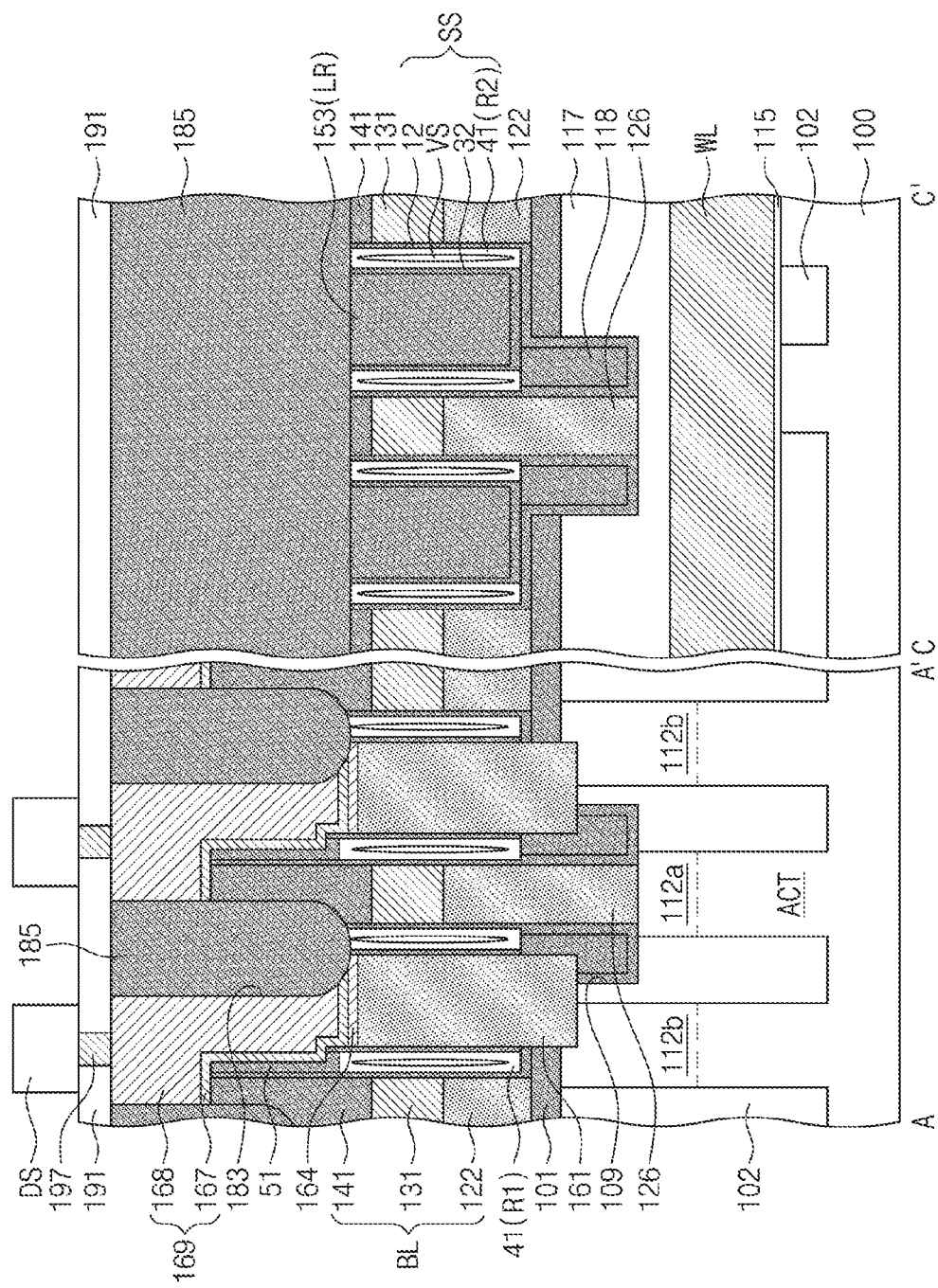
FIG. 17 is a cross-sectional view taken along lines A-A' and C-C' of FIG. 1, illustrating a semiconductor memory device according to some example embodiments.

FIG. 17 is a cross-sectional view taken along lines A-A' and C-C' of FIG. 1, illustrating a semiconductor memory device according to some example embodiments. Differences between FIG. 17 and FIGS. 1 and 2A to 2D will be mainly described below.

Referring to FIG. 17, the separation insulation layer 185 may contact the second spacer 41. The separation region 183 in which the separation insulation layer 185 is formed may expose the second spacer 41. For example, the separation region 183 may expose the first regions R1 and the second regions R2 of the second spacer 41. Thus, the separation insulation layer 185 may contact the first and second portions R1 and R2 of the second spacer 41.

In some embodiments, the separation insulation layer 185 may contact the first portions R1 or the second portions R2 of the second spacer 41. For example, the separation insulation layer 185 may contact the first portions R1 of the second spacer 41 and be spaced apart from the second portions R2 of the second spacer 41. Alternatively, the separation insulation layer 185 may contact the second portions R2 of the second spacer 41 and be spaced apart from the first portions R1 of the second spacer 41. In this case, a height of the second spacer 41 may be varied according to a location of the second spacer 41. As an example, upper surfaces of the first portions R1 may be lower or higher than upper surfaces of the second portions R2 with respect to the upper surface of the substrate 100.

Figure 18:
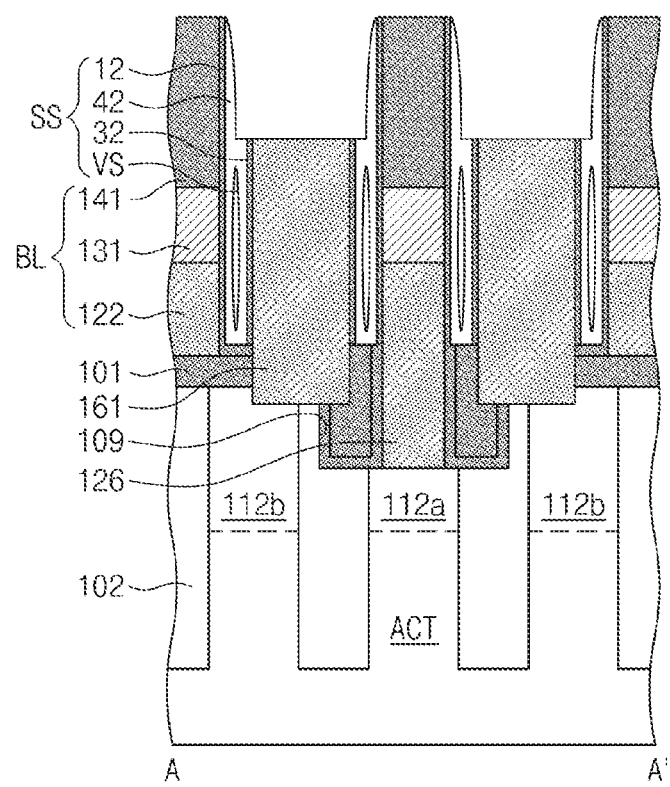
FIGS. 18 and 19 are cross-sectional views taken along lines A-A' and C-C' of FIG. 1, illustrating a method of manufacturing the semiconductor memory device according to some example embodiments.
Figure 19:
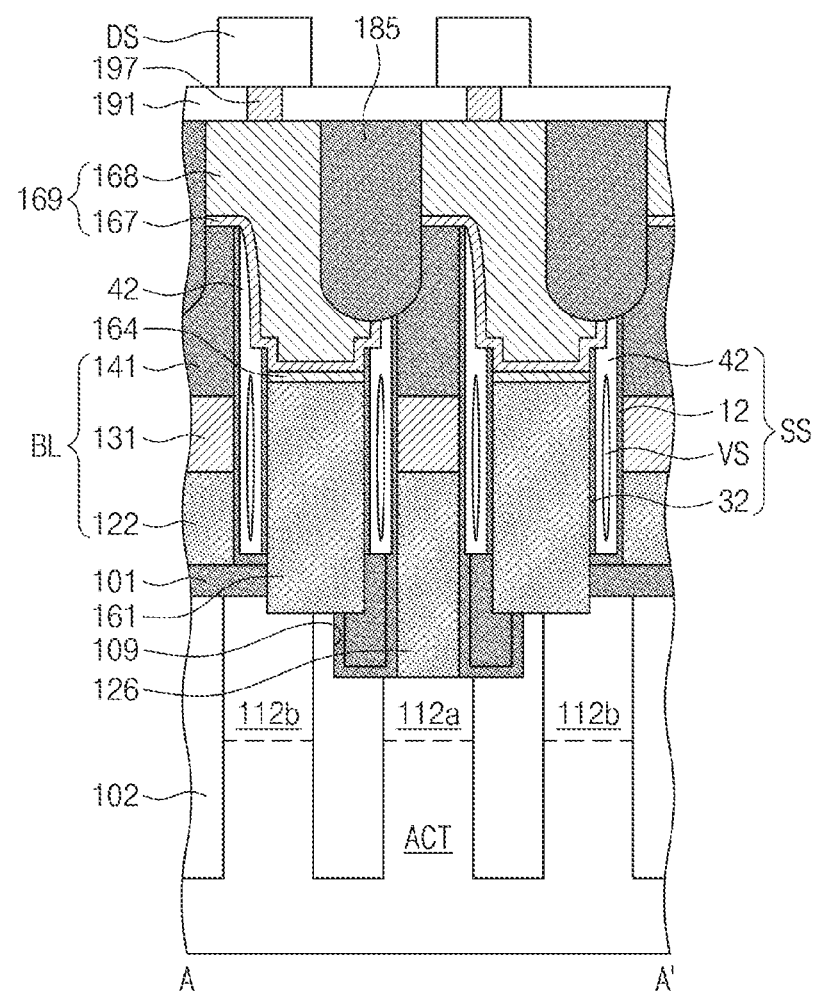

FIGS. 18 and 19 are cross-sectional views taken along lines A-A' and C-C' of FIG. 1, illustrating a semiconductor memory device and a method of manufacturing the semiconductor memory device according to some example embodiments. FIGS. 18 and 19 compared to FIGS. 3 to 16 will be mainly described below.

Referring to FIG. 18, second spacers 42 may be formed on the resulting structure of FIG. 14. The second spacers 42 may fill the gap regions RS (see FIG. 14) and cover upper sidewalls of the first spacers 12. The second spacers 42 may include, for example, silicon oxycarbide. The forming process of the fourth spacers 51 described with reference to FIG. 15 may be omitted. The upper surfaces of the second contact plugs 161 may be substantially coplanar with the upper surfaces of the third spacers 32.

Referring to FIG. 19, the processes as described with reference to FIGS. 16 and 2A to 2D may be performed. The connection pads 169 (e.g., the barrier layer 167) may contact upper portions of the second spacers 42.

Figure 25:
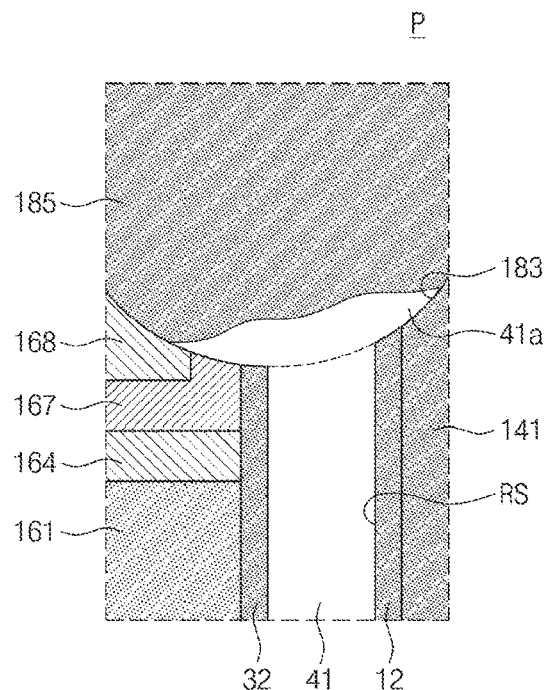
FIGS. 25 and 26 are enlarged views of portion P of FIG. 24.
Figure 26:
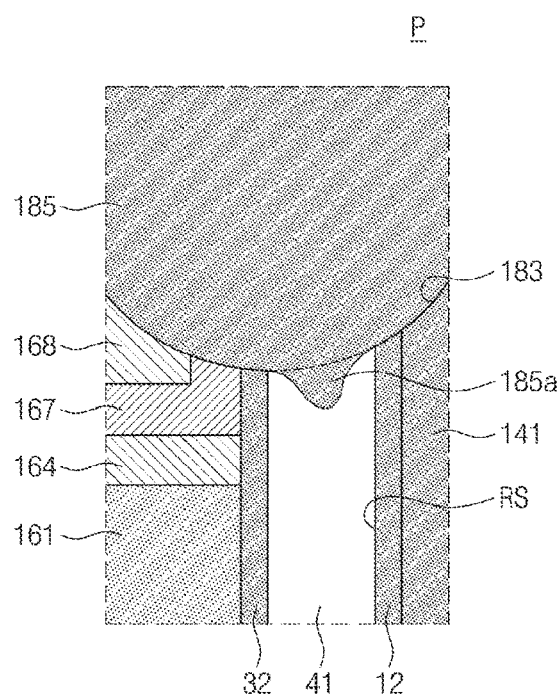

FIGS. 20, 21, 22, 23, and 24 are cross-sectional views taken along lines A-A' and C-C' of FIG. 1, illustrating a method of manufacturing a semiconductor memory device according to some example embodiments. FIGS. 25 and 26 are enlarged views of portion P of FIG. 24. FIGS. 20 to 26 compared to FIGS. 3 to 16 will be mainly described below.

Figure 20:
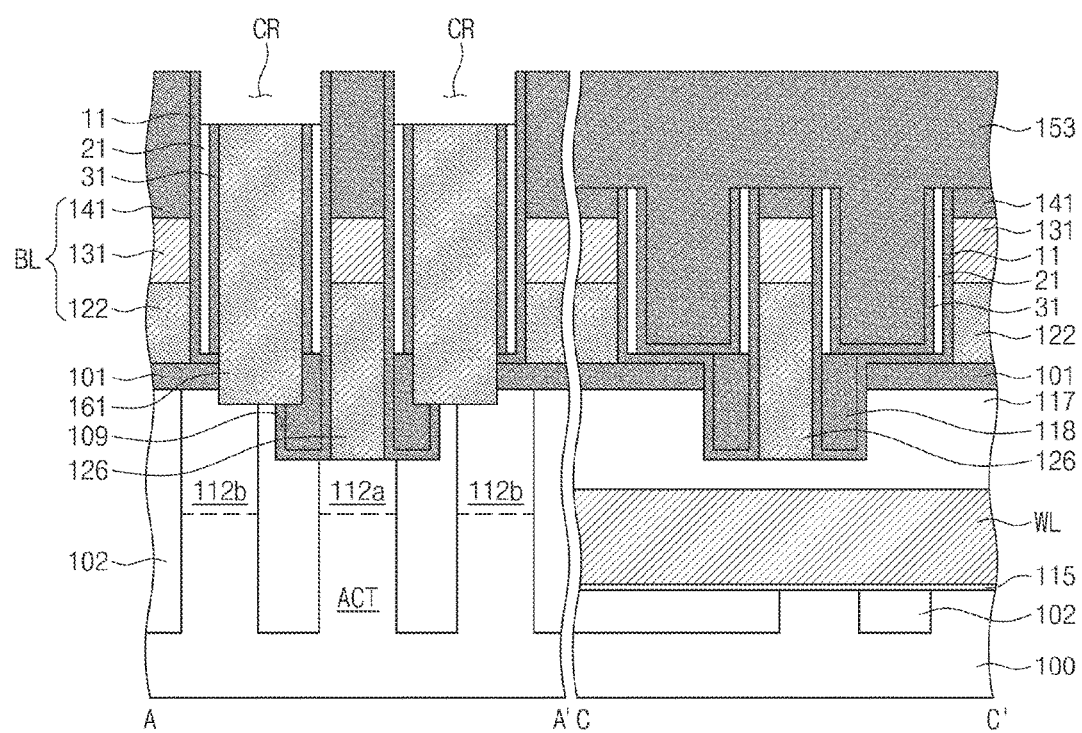
FIGS. 20, 21, 22, 23, and 24 are cross-sectional views taken along lines A-A' and C-C' of FIG. 1, illustrating a method of manufacturing a semiconductor memory device according to some example embodiments.

Referring to FIG. 20, the second contact plugs 161 may be formed in lower portions of the contact regions CR (see FIG. 11). The second contact plugs 161 may have higher upper surfaces than those described with reference to FIG. 13. Upper portions of the sacrificial spacers 21 and an upper portion of the third spacer layer 31 that are exposed by the second contact plugs 161 may be etched. A height of the upper surfaces of the second contact plugs 161 may be adjusted by an etch back process.

Figure 21:
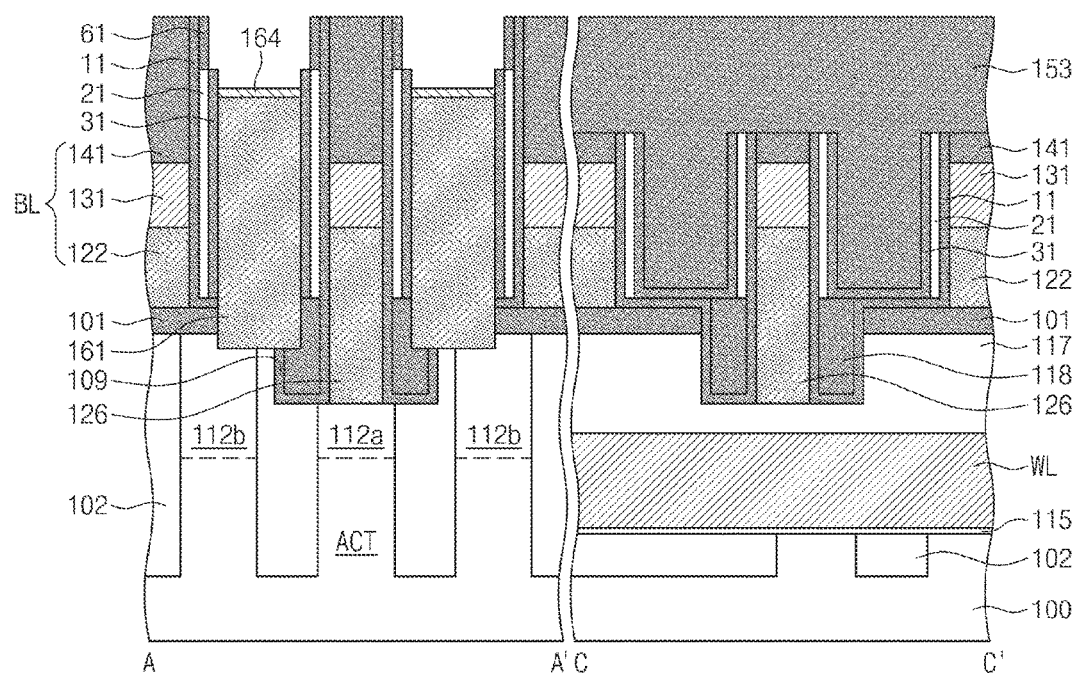

Referring to FIG. 21, fifth spacers 61 may be formed on the sacrificial spacers 21, respectively. The fifth spacers 61 may be formed on an upper sidewall of the first spacer layer 11. The fifth spacers 61 may include, for example, silicon nitride or silicon oxynitride. As an example, the fifth spacers 61 may include the same material as the first and third spacer layers 11 and 31. The forming process of the fifth spacers 61 may include an etch process, such as an etch back process. During the above etch process, upper portions of the second contact plugs 161 may also be etched. Thus, the upper surfaces of the second contact plugs 161 may be lower than an upper surface of the third spacer layer 31. The ohmic layers 164 may be formed on the second contact plugs 161, respectively.

Figure 22:
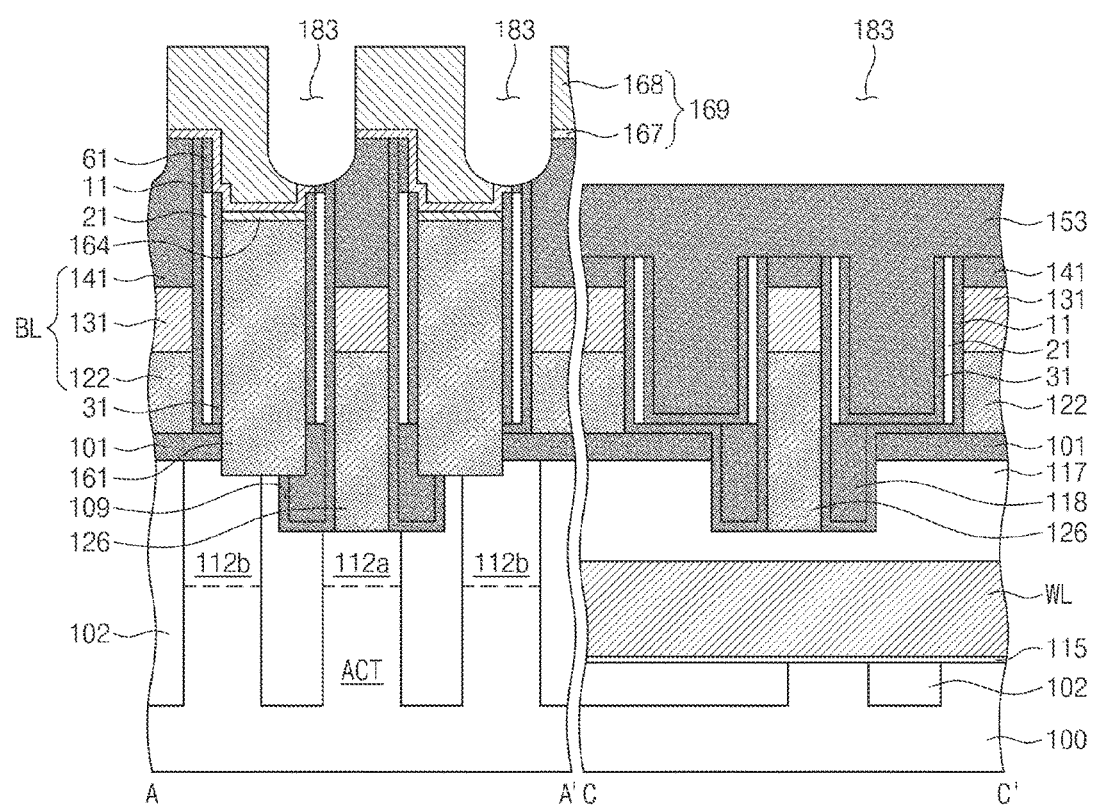

Referring to FIG. 22, the connection pads 169 may be formed on the ohmic layers 164, respectively. The connection pads 169 may be formed by sequentially forming the barrier layer 167 and the metal layer 168 and performing a patterning process to form the separation region 183 therethrough. The separation region 183 may expose upper portions of the mask patterns 141 and upper surfaces of the fence insulating patterns 153.

Figure 23:
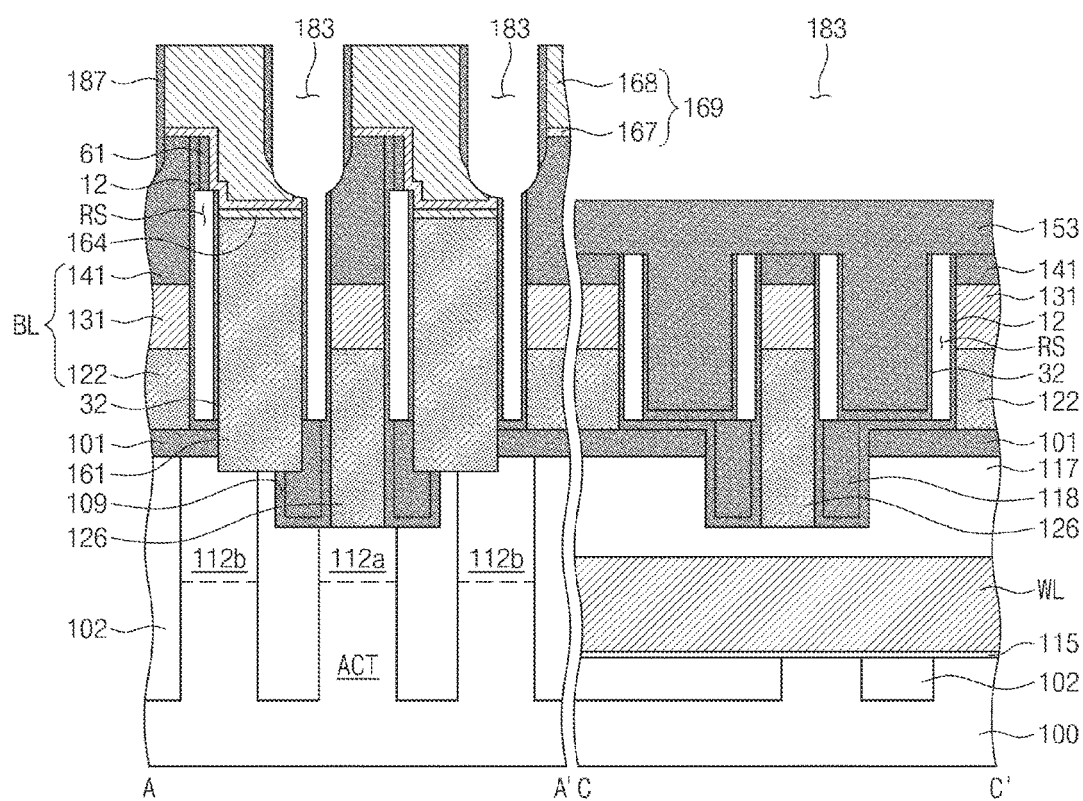

Referring to FIG. 23, after forming a sidewall spacer 187 on a sidewall of the separation region 183, an anisotropic etch process may be performed such that the separation region 183 may extend toward the substrate 100. The sidewall spacer 187 may include, for example, silicon nitride or silicon oxynitride. The separation region 183 may expose the sacrificial spacers 21. As an example, the separation region 183 may expose first portions of the sacrificial spacers 21 between each of the second contact plugs 161 and each of the bit line structures BL and/or second portions of the sacrificial spacers 21 between each of the fence insulating patterns 153 and each of bit line structures BL.

The sacrificial spacers 21 may be removed through the separation region 183 to form the gap regions RS. As an example, the sacrificial spacers 21 may be removed through the first portions thereof. In some embodiments, The sacrificial spacers 21 may be removed through the second portions thereof. In some embodiments, the first and second portions of the sacrificial spacers 21 may be removed at the same time.

The gap regions RS may be communicated with the separation region 183. The first and third spacer layers 11 and 31 may be thinned, thus forming the first spacers 12 and the third spacers 32.

Figure 24:
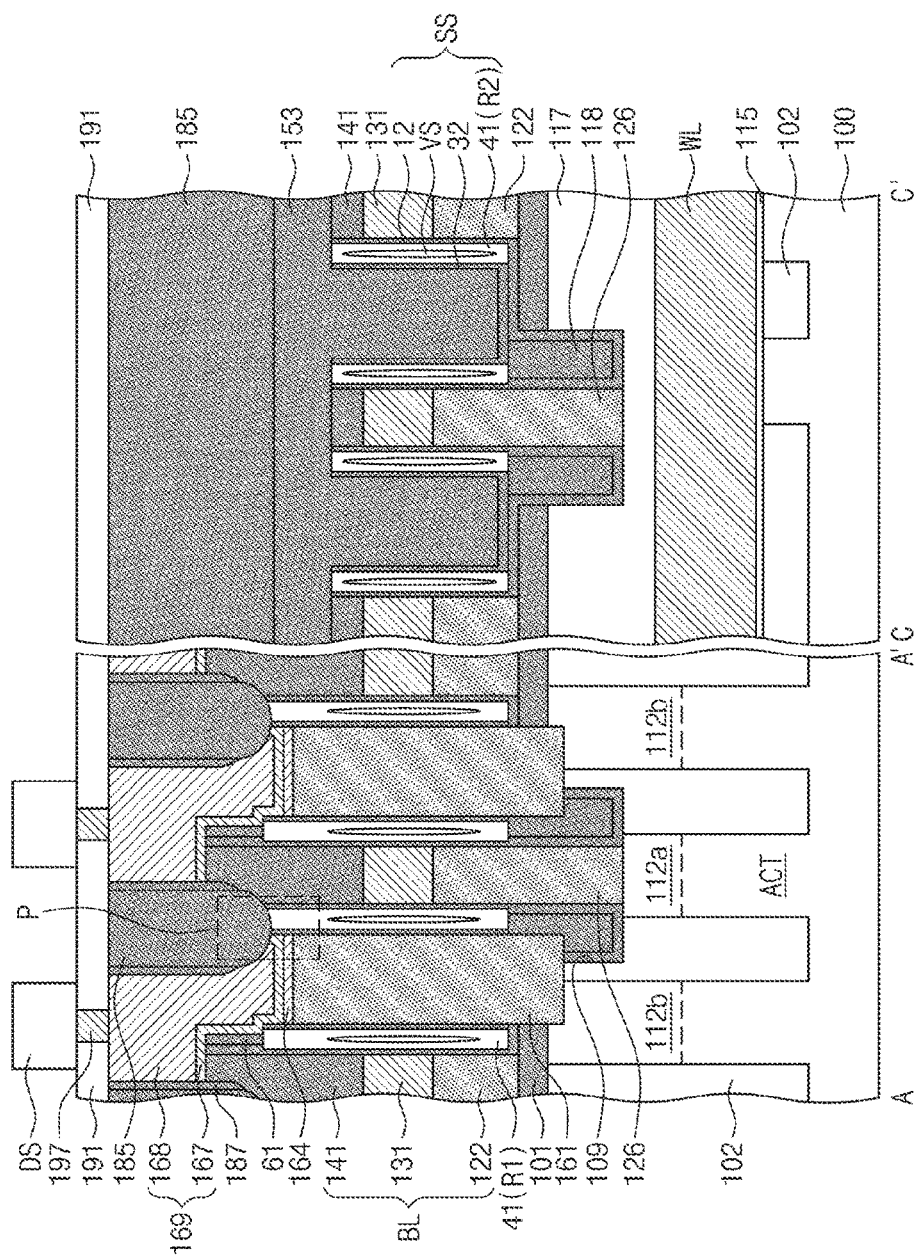

Referring to FIG. 24, the second spacers 41 may be formed in the gap regions RS, respectively. The second spacers 41 may each include a void VS therein. An insulating material for forming the second spacers 41 may be supplied into the gap regions RS through the separation region 183. The second spacers 41 may be formed by forming an insulating layer filling at least a portion of each of the gap regions RS and removing a portion of the insulating layer located outside the gap regions RS. As an example, the insulating layer may completely fill the separation region 183, and the portion of the insulating layer outside the gap regions RS may be removed by an etch back process. In some embodiments, the insulating layer may be conformally formed along an inner surface of the separation region 183, and the portion of the insulating layer outside the gap regions RS may be removed by a wet etch process.

Each of the second spacers 41 may include the first portions R1 between each of the second contact plugs 161 and each of the bit line structures BL and the second portions R2 between each of the fence insulating patterns 153 and each of the bit line structures BL. Upper surfaces of the first portions R1 may be higher than upper surfaces of the second portions R2 with respect to the upper surface of the substrate 100. In some embodiments, the upper surfaces of the first portions R1 may be coplanar with the upper surfaces of the second portions R2.

The separation insulation layer 185 may be formed in the separation region 183. Referring to FIGS. 25 and 26, an interface between the separation insulation layer 185 and the second spacer 41 may be uneven. In some embodiments, referring to FIG. 25, a portion 41a of the second spacer 41 may extend into the separation region 183. In some embodiments, refer to FIG. 26, a portion 185a of the separation insulation layer 185 may extend into the gap region RS.

Figure 33:
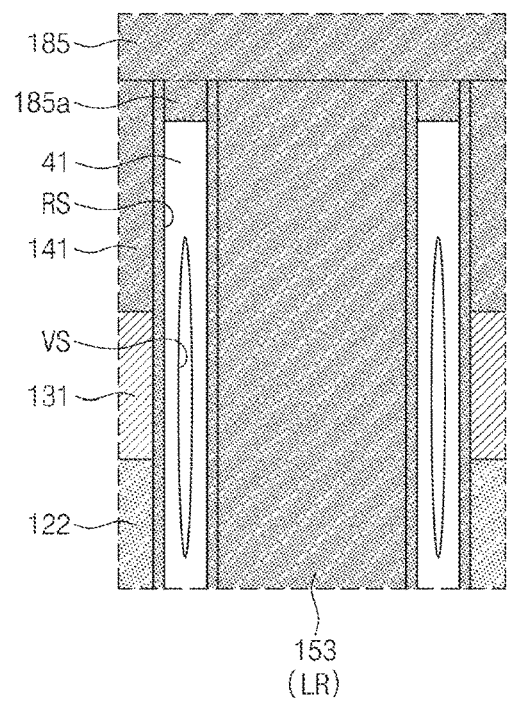
FIGS. 33 and 34 are enlarged views of portion S of FIG. 32.
Figure 34:
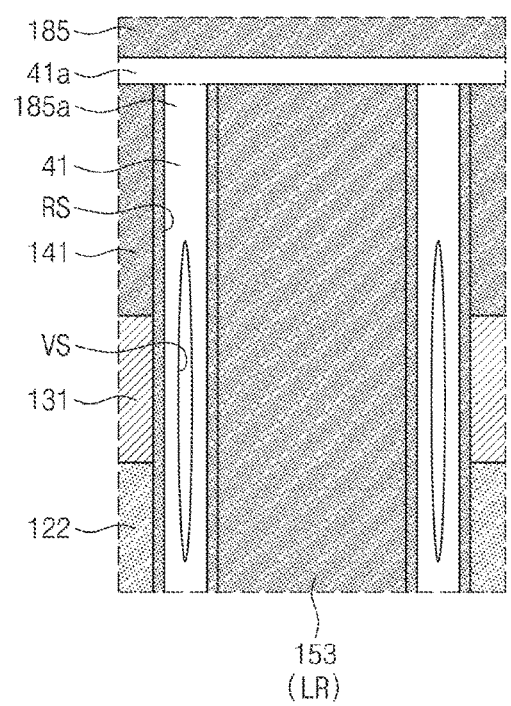

FIGS. 27, 28, 29, 30, 31, and 32 are cross-sectional views taken along lines A-A' and C-C' of FIG. 1, illustrating a method of manufacturing a semiconductor memory device according to some example embodiments. FIGS. 33 and 34 are enlarged views of portion S of FIG. 32. FIGS. 27 to 34 compared to FIGS. 3 to 16 will be mainly described below.

Figure 27:
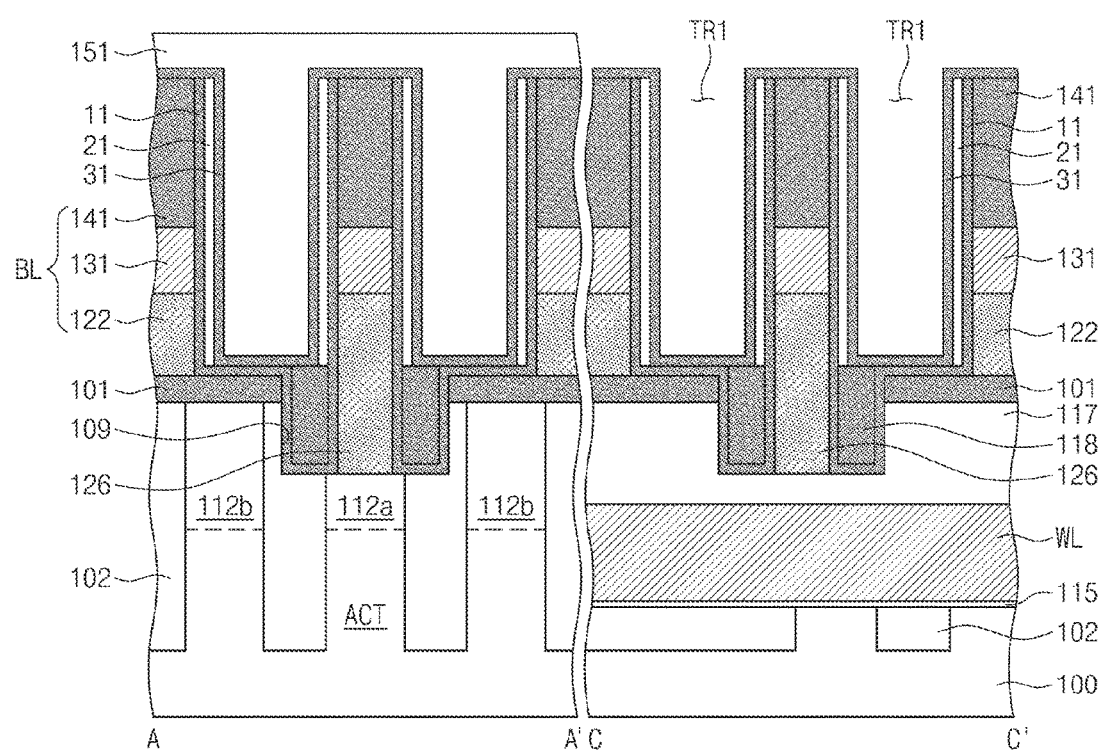
FIGS. 27, 28, 29, 30, 31, and 32 are cross-sectional views taken along lines A-A' and C-C' of FIG. 1, illustrating a method of manufacturing a semiconductor memory device according to some example embodiments.

Referring to FIG. 27, the mold patterns 151 may be formed on the resulting structure of FIG. 7. The mold patterns 151 may respectively fill portions of the first trenches TR1 and extend onto the bit line structures BL.

During the forming of the mold patterns 151, the bit line structures BL (e.g., upper portions of the mask patterns 141) may not be etched or relatively less etched compared to the embodiment described with reference to FIG. 9. This difference may be caused by adjustment of an etch selectivity in the forming process of the mold patterns 151.

Figure 28:
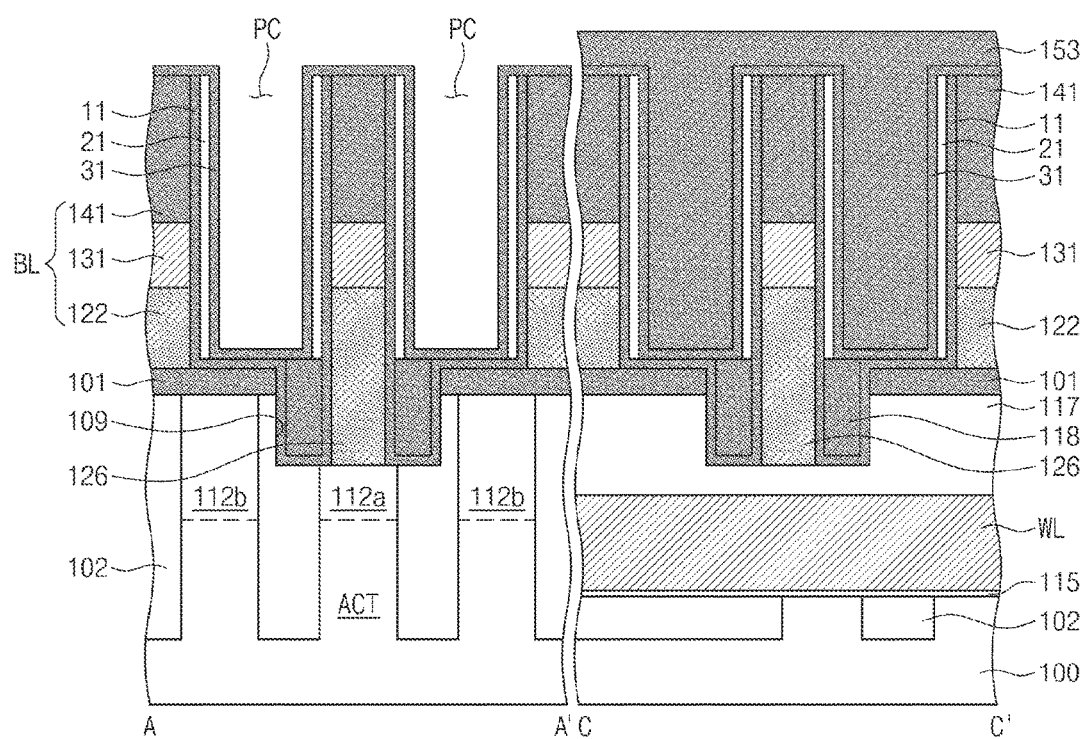

Referring to FIG. 28, the fence insulating patterns 153 may be formed between each of the mold patterns 151. The mold patterns 151 may be selectively removed, thus forming preliminary contact regions PC, which each are defined by facing sidewalls of adjacent fence insulating patterns 153 and facing sidewalls of adjacent bit line structures BL.

Figure 29:
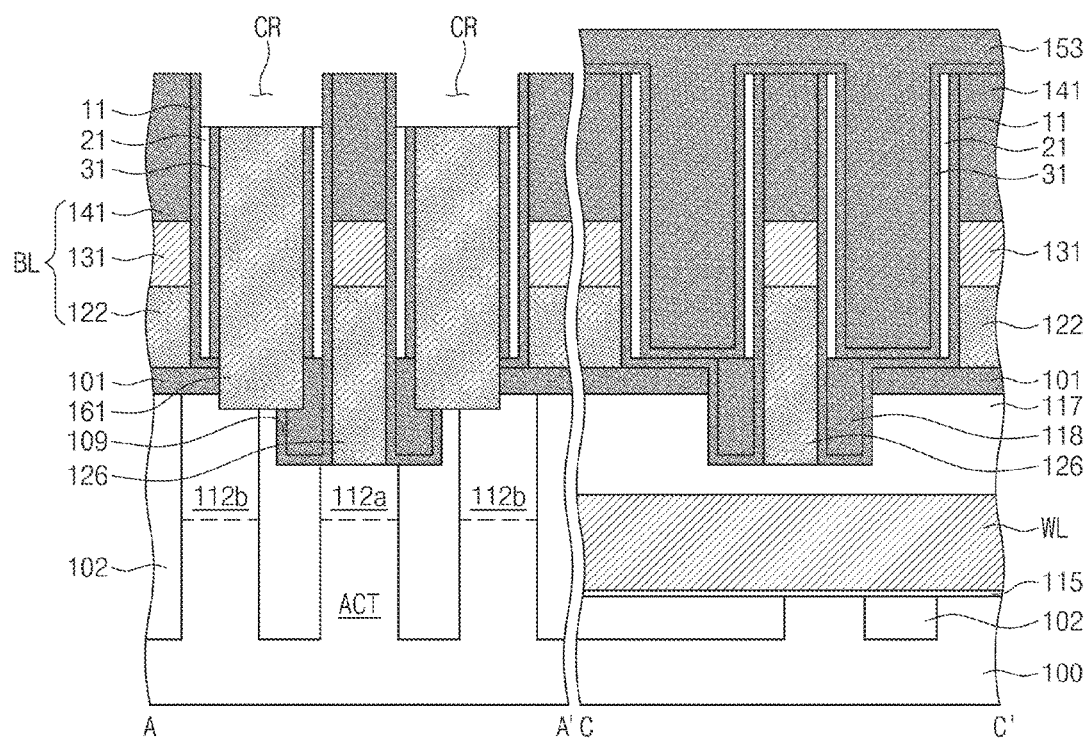

Referring to FIG. 29, an anisotropic etch process may be performed using the fence insulating patterns 153 and the mask patterns 141 as an etch mask to expose the second impurity regions 112b. By the above etch process, the lower insulating pattern 101 and portions of the first and third spacer layers 11 and 31 may be removed together. Therefore, the preliminary contact regions PC may extend toward the substrate 100, thus forming the contact regions CR. The second contact plugs 161 may be formed in lower portions of the contact regions CR, respectively. Upper portions of the sacrificial spacers 21 and an upper portion of the third spacer layer 31 that are exposed by the second contact plugs 161 may be etched.

Figure 30:
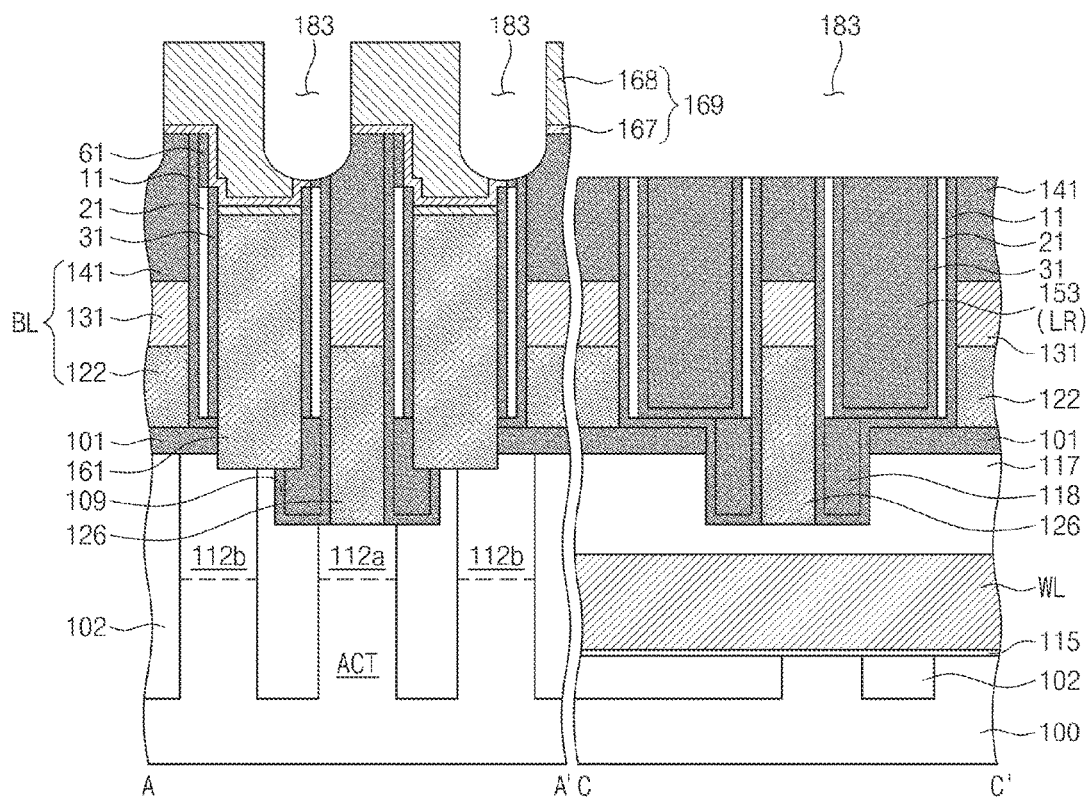

Referring to FIG. 30, the processes described with reference to FIGS. 21 and 22 may be performed. Thus, upper portions of the fence insulating patterns 153 may be etched to form the separation region 183, such that the lower portions LR of the fence insulating patterns 153, that are spaced from each other with the respective bit line structures BL therebetween, may be formed. The separation region 183 may expose portions of the sacrificial spacers 21 adjacent to the lower portions LR of the fence insulating patterns 153. Portions of the sacrificial spacers 21 adjacent to the second contact plugs 161 may not be exposed.

Figure 31:
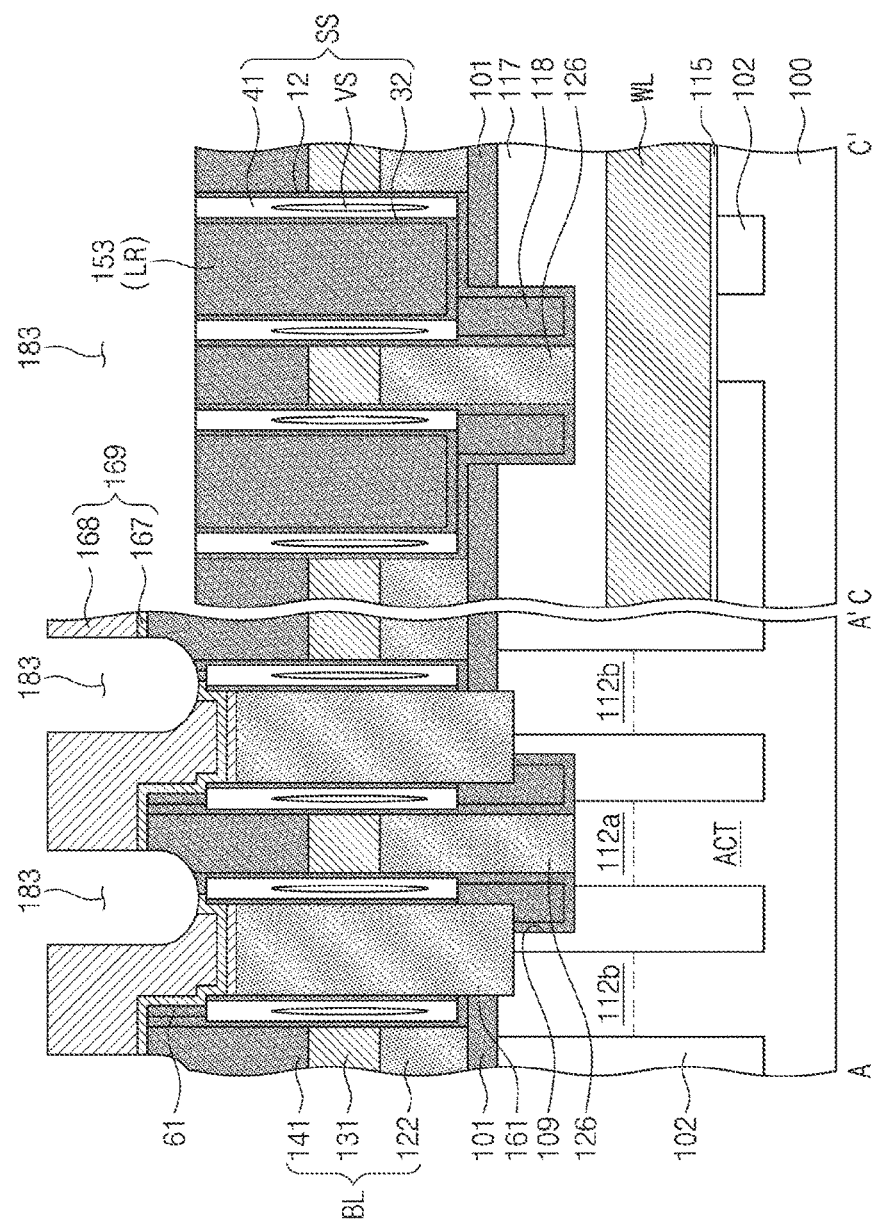

Referring to FIG. 31, the sacrificial spacers 21 may be selectively removed to form the gap regions RS. The sacrificial spacers 21 may be removed through the separation region 183. The first and third spacer layers 11 and 31 may be thinned in the first direction D1, thus forming the first spacers 12 and the third spacers 32. The second spacers 41 each including a void VS may be formed in the gap regions RS, respectively. The connection pads 169 may be formed before forming the second spacers 41.

Figure 32:
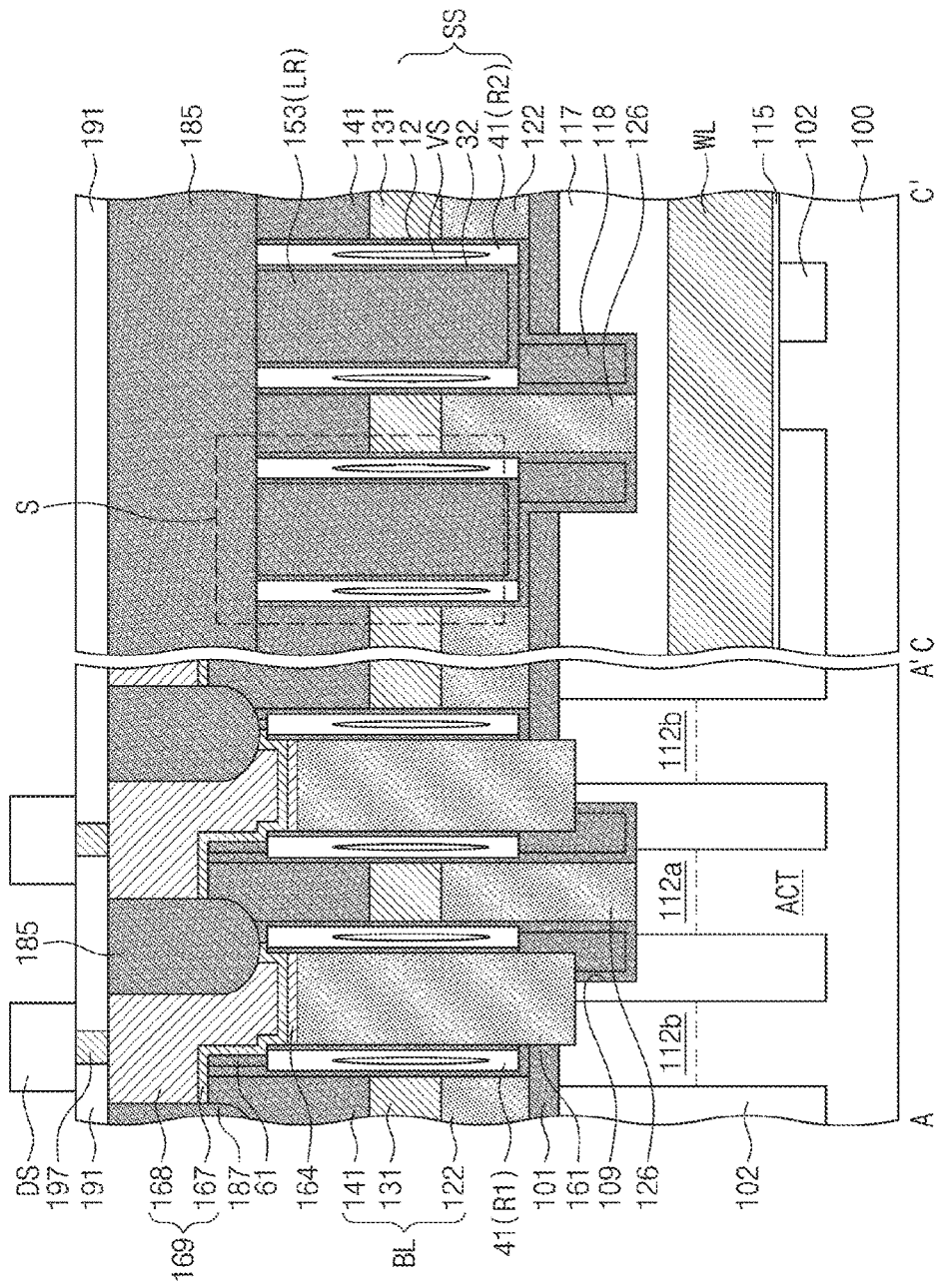

Referring to FIG. 32, the separation insulation layer 185 may be formed in the separation region 183. Thereafter, the data storage units DS may be formed. According to the present example embodiment, a height of upper surfaces of the second regions R2 of the second spacers 41 may be greater than that of upper surfaces of the first regions R1 of the second spacers 41.

A boundary region between each of the second regions R2 of the second spacers 41 and the separation insulation layer 185 may be substantially positioned at the same level as the upper surfaces of the lower regions LR of the fence insulating patterns 153. In some embodiments, referring to FIG. 33, a portion 185a of the separation insulation layer 185 may extend into each of the gap regions RS. In some embodiments, referring to FIG. 34, a portion 41a of each of the second spacers 41 may extend onto the lower region LR of the fence insulating pattern 153. For example, adjacent portions 41a of adjacent second spacers 41 may be coupled to each other, thus forming a continuously extending layer on the lower portion LR of the fence insulating pattern 153.

While inventive concepts have been shown and described with reference to some example embodiments thereof, it will be understood by those of ordinary skill in the art that various changes in form and details may be made thereto without departing from the spirit and scope of inventive concepts as set forth by the following claims.

What is claimed is:

1. A semiconductor memory device comprising;
a substrate including active regions;
word lines in the substrate, each of the word lines extending in a first direction parallel to an upper surface of the substrate;
bit line structures connected to the active regions, respectively, each of the bit line structures extending in a second direction crossing the first direction; and
spacer structures on sidewalls of respective ones of the bit line structures,
each of the spacer structures including a first spacer, a second spacer, and a third spacer,
the second spacer being disposed between the first spacer and the third spacer,
the second spacer including a void, and
a height of the second spacer being greater than a height of the void with respect to the upper surface of the substrate,
the second spacer filling a bottom portion of a gap region defined by the first spacer and the third spacer;
contact plugs between each of the bit line structures, the contact plugs being connected to the active regions, respectively;
connection pads on the contact plugs, respectively; and
a separation layer between each of the connection pads, wherein
a lowermost surface of the separation layer is higher than an uppermost surface of the second spacer with respect to the upper surface of the substrate,
an upper surface of the third spacer is lower than an upper surface of the first spacer with respect to the upper surface of the substrate,
an upper surface of the second spacer is lower than the upper surface of the third spacer with respect to the upper surface of the substrate, and
each of the spacer structures further includes a fourth spacer on a sidewall of the first spacer and on the upper surface of the second spacer.

2. The semiconductor memory device according to claim 1, wherein a lowermost surface of the separation layer contacts the uppermost surface of the second spacer.

3. The semiconductor memory device according to claim 2, further comprising;
fence insulating patterns between each of the contact plugs, wherein
the second spacer includes first portions and second portions,
the first portions of the second spacer are between each of the contact plugs and each of the bit line structures,
second portions of the second spacer are between the each of the fence insulating patterns and each of the bit line structures, and
the separation layer contacts at least one of the first portions of the second spacer or the second portions of the second spacer.

4. The semiconductor memory device according to claim 3, wherein upper surface of the first portions of the second spacer are positioned at a level different from upper surfaces of the second portions of the second spacer with respect to the upper surface of the substrate.

5. The semiconductor memory device according to claim 1, wherein
a thickness of the second spacer is greater than a thickness of the first spacer, and
the thickness of the second spacer is greater than a thickness of the third spacer.

6. The semiconductor memory device according to claim 1, wherein the height of the void corresponds to a major axis of the void, and the major axis of the void extends in a third direction perpendicular to the upper surface of the substrate.

7. A semiconductor memory device comprising:
a substrate including an active region;
a bit line structure on the substrate, the bit line structure being connected to the active regions; and
a spacer structure on a sidewall of the bit line structure, the spacer structure including a first spacer, a second spacer, and a third spacer that are sequentially disposed on the sidewall of the bit line structure,
the second spacer including a void defined by an inner surface of the second spacer,
an upper surface of the third spacer being lower than an upper surface of the first spacer with respect to an upper surface of the substrate;
contact plugs connected to the active region, respectively;
connection pads on the contact plugs, respectively; and
a separation insulation layer between the connection pads,
wherein an upper surface of the second spacer is spaced apart from a lower surface of the separation insulation layer.

8. The semiconductor memory device according to claim 7, wherein the first spacer extends below the second spacer.

9. A method of manufacturing a semiconductor memory device, comprising:
forming active regions in a substrate;
forming bit line structures on the substrate, the bit line structures crossing the active regions;
forming spacer structures on sidewalls of the bit line structures, respectively the forming the spacer structures including,
sequentially forming a first spacer, a sacrificial spacer, and a third spacer on each of the sidewalls of the bit line structures,
removing the sacrificial spacer to form a gap region, and
forming a second spacer in the gap region, an inner surface of the second spacer defining a void that is surrounded by a portion of the second spacer, the void being spaced apart from the first spacer and the third spacer by the portion of the second spacer; and
forming contact plugs between each of the bit line structures, the contact plugs for connecting to the active regions, respectively.

10. The method according to claim 9, further comprising;
forming connection pads on the contact plugs, respectively,
wherein the forming the connection pads is performed before the forming the second spacer.

11. The method according to claim 10, wherein
the forming the connection pads includes forming a metal layer, and forming a separation region by patterning the metal layer, and
the removing the sacrificial spacer includes removing the sacrificial spacer through the separation region.

12. The method according to claim 11, further comprising:
forming fence insulating patterns on the substrate, the fence insulating patterns crossing the bit line structures, wherein the separation region exposes at least one of, first portions of the sacrificial spacer between each of the contact plugs and each of the bit line structures, and second portions of the sacrificial spacer between each of the fence insulating patterns and each of the bit line structures.

13. The method according to claim 9, further comprising:
forming connection pads on the contact plugs, respectively, after the forming the second spacer.

14. The method according to claim 13, further comprising:
forming fence insulating patterns crossing the bit line structures,
the forming the fence insulating patterns including defining contact regions by facing sidewalls of adjacent ones of the bit line structures and facing side-walls of adjacent ones of the fence insulating patterns,
the forming the contact plugs includes forming the contact plugs in lower portions of the contact regions, respectively,
the removing the sacrificial spacer is performed after the forming the contact plugs in lower portions of the contact regions, respectively, and
the sacrificial spacer is removed through the contact regions.

15. The method according to claim 9, wherein the first spacer and the second spacer include a material having an etch selectivity with respect to the sacrificial spacer.

16. The method according to claim 9, wherein the removing the sacrificial spacer includes reducing a thickness of the first spacer and a thickness of the third spacer.

* * * * *